(12) United States Patent
Qi et al.

(10) Patent No.: US 10,249,538 B1
(45) Date of Patent: Apr. 2, 2019

(54) METHOD OF FORMING VERTICAL FIELD EFFECT TRANSISTORS WITH DIFFERENT GATE LENGTHS AND A RESULTING STRUCTURE

(71) Applicant: GLOBALFOUNDRIES INC., Grand Cayman (KY)

(72) Inventors: Yi Qi, Niskayuna, NY (US); Hsien-Ching Lo, Clifton Park, NY (US); Jianwei Peng, Latham, NY (US); Wei Hong, Clifton Park, NY (US); Yanping Shen, Saratoga Springs, NY (US); Yongjun Shi, Clifton Park, NY (US); Hui Zang, Guilderland, NY (US); Ruilong Xie, Schenectady, NY (US); Kangguo Cheng, Schenectady, NY (US); Tenko Yamashita, Schenectady, NY (US); Chun-chen Yeh, Danbury, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/723,472

(22) Filed: Oct. 3, 2017

(51) Int. Cl.
*H01L 21/8234* (2006.01)
*H01L 27/088* (2006.01)
(Continued)

(52) U.S. Cl.
CPC .... *H01L 21/823456* (2013.01); *H01L 21/311* (2013.01); *H01L 21/3213* (2013.01);
(Continued)

(58) Field of Classification Search
CPC ........... H01L 21/823456; H01L 21/311; H01L 21/823462; H01L 27/088; H01L 21/823487; H01L 21/3213
See application file for complete search history.

(56) References Cited

U.S. PATENT DOCUMENTS 5,637,898 A 6/1997 Baliga
7,148,541 B2 12/2006 Park et al.
(Continued)

OTHER PUBLICATIONS

Orlowski et al., "Si, SiGe, Ge, and III-V Semiconductor Nanomembranes and Nanowires Enabled by SiGe Epitaxy", ECS Transactions, 33 (6) 777-789 (2010) 10.1149/1.3487608 © The Electrochemical Society.
Sachid et al., "Denser and More Stable SRAM Using FinFETs with Multiple Fin Heights", IEEE Transactions on Electron Devices, vol. 59, No. 8, Aug. 2012, pp. 2037-2041.

*Primary Examiner* — Syed I Gheyas
(74) *Attorney, Agent, or Firm* — Gibb & Riley, LLC; Anthony J. Canale

(57) ABSTRACT

Disclosed is a method of forming a structure with multiple vertical field effect transistors (VFETs). In the method, lower source/drain regions are formed on a substrate such that semiconductor fins extend vertically above the lower source/drain regions. Lower spacers are formed on the lower source/drain regions and positioned laterally adjacent to the semiconductor fins. Gates, having co-planar top surfaces, are formed on the lower spacers and positioned laterally adjacent to the semiconductor fins. However, process steps are performed prior to gate formation to ensure that the top surfaces of the lower source/drain region and lower spacer of a first VFET are below the levels of the top surfaces of the lower source/drain region and lower spacer, respectively, of a second VFET. As a result, the first VFET will have a longer gate, higher threshold voltage and lower switching speed. Also disclosed is the structure formed according to the method.

19 Claims, 20 Drawing Sheets

(51) Int. Cl.
*H01L 21/3213* (2006.01)
*H01L 21/311* (2006.01)

(52) U.S. Cl.
CPC ............... *H01L 21/823462* (2013.01); *H01L 21/823487* (2013.01); *H01L 27/088* (2013.01)

(56) References Cited

U.S. PATENT DOCUMENTS

| | | |
|---|---|---|
| 7,569,913 B2 | 8/2009 | Enicks |
| 9,041,062 B2 | 5/2015 | Cheng et al. |
| 9,087,897 B1 | 7/2015 | Anderson et al. |
| 9,105,689 B1 | 8/2015 | Fanelli |
| 9,299,835 B1 | 3/2016 | Anderson et al. |
| 9,536,793 B1 | 1/2017 | Zhang et al. |
| 9,570,356 B1 * | 2/2017 | Balakrishnan ............................. H01L 21/823487 |
| 9,653,465 B1 | 5/2017 | Balakrishnan et al. |
| 10,008,417 B1 * | 6/2018 | Bao ................. H01L 21/823487 |
| 2015/0270161 A1 | 9/2015 | Fanelli |
| 2016/0190312 A1 | 6/2016 | Zhang et al. |
| 2017/0213900 A1 | 7/2017 | Cheng et al. |
| 2018/0151561 A1 * | 5/2018 | Cantoro ................ H01L 27/088 |

\* cited by examiner

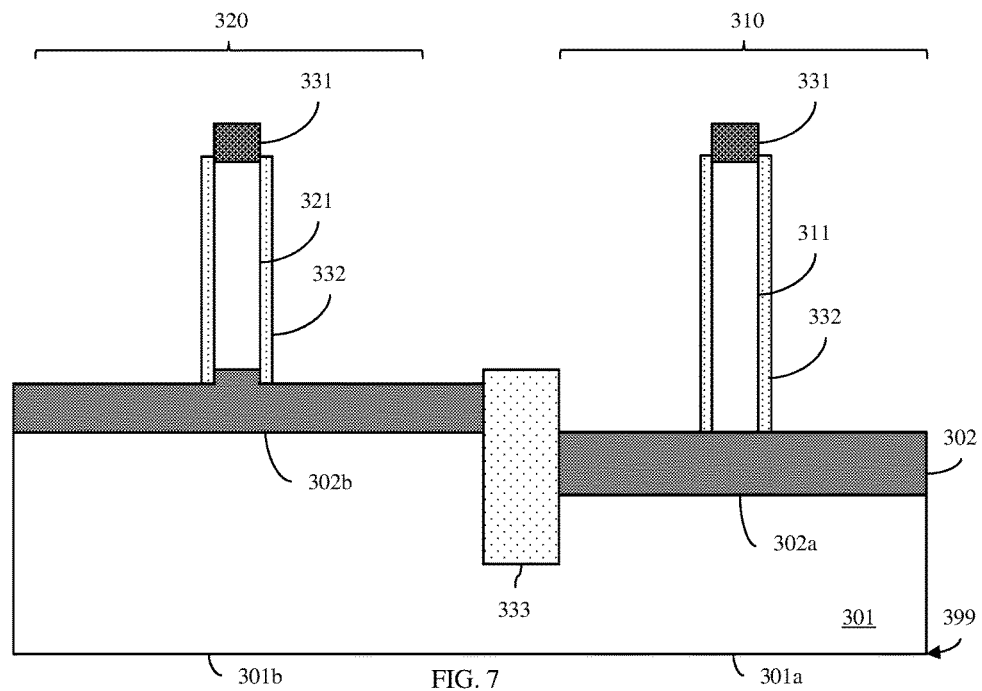
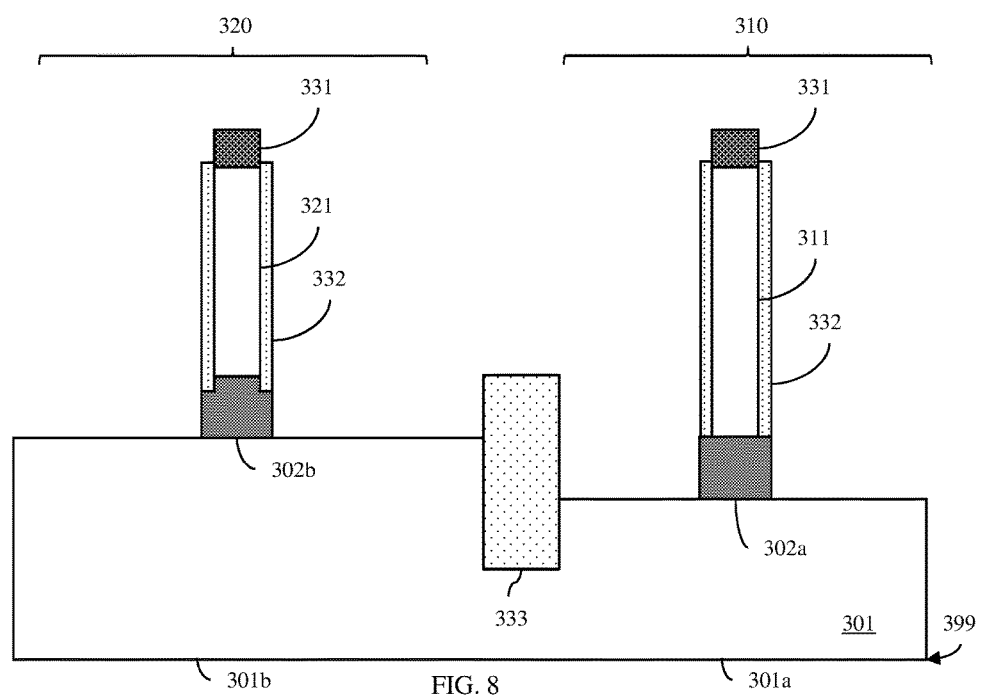

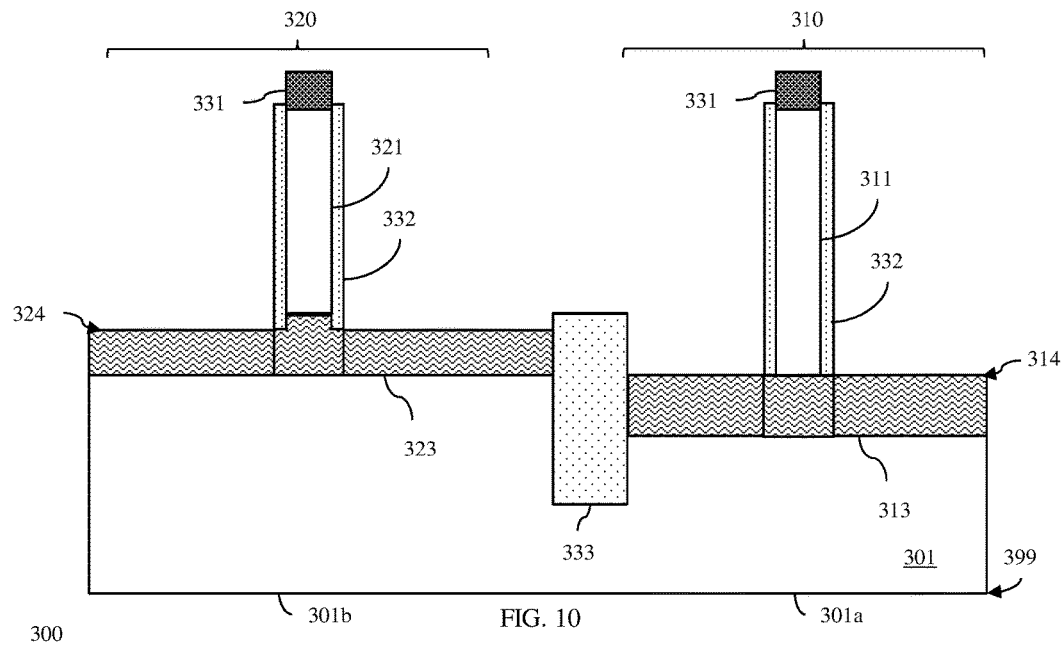
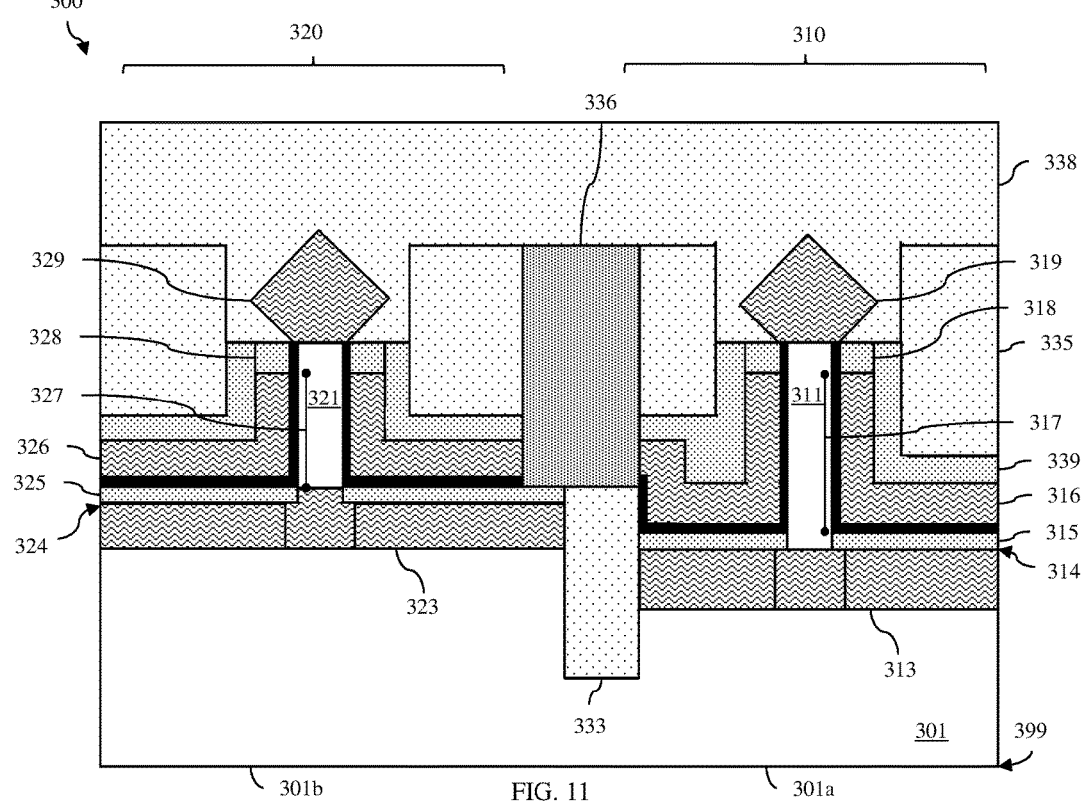

METHOD OF FORMING VERTICAL FIELD EFFECT TRANSISTORS WITH DIFFERENT GATE LENGTHS AND A RESULTING STRUCTURE

BACKGROUND

Field of the Invention

The present invention relates to vertical field effect transistors (VFETs) and, more particularly, to a method of forming VFETs with different gate lengths on the same substrate and the resulting integrated circuit (IC) structure.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths. Unfortunately, the smaller channel lengths resulted in a corresponding increase in short channel effects. In response, fin-type FETs (FINFETs) were developed. A fin-type FET (FINFET) is a non-planar FET that incorporates a semiconductor fin (i.e., a relatively tall, thin, rectangular-shaped, semiconductor body) and, within the semiconductor fin, a channel region positioned laterally between source/drain regions. A gate is positioned adjacent to the top surface and opposing sidewalls of the semiconductor fin at the channel region. Thus, the FINFET exhibits multi-dimensional field effects as compared to the single-dimensional field effects exhibited by a planar FET and, thereby allows for improved gate control over the channel region.

Recently, vertical FETs (VFETs) (also referred to in the art as gate-all-around FETs (GAAFETs)) were developed to provide an increase in device density (i.e., an increase in the number of devices within a given chip area) over that achievable with FINFETs. A VFET, like a FINFET, incorporates a semiconductor fin (i.e., a relatively tall, thin, rectangular-shaped, semiconductor body). However, in this case, the FET components are stacked vertically on a substrate as opposed to being positioned side by side across a substrate. Specifically, a VFET typically includes a lower source/drain region in a substrate, a semiconductor fin that extends upward from the lower source/drain region, and an upper source/drain region that is epitaxially grown on the top surface of the semiconductor fin. A gate (e.g., a metal gate) laterally surrounds the semiconductor fin, which functions as the channel region. The gate is electrically isolated from the lower source/drain region and the upper source/drain region by lower and upper spacer layers, respectively. While multiple essentially identical VFETs can easily be produced on a substrate with minimal impact on manufacturing efficiency and costs, oftentimes IC designs require devices with different switching speeds (e.g., due to different threshold voltages (Vts)). Unfortunately, forming VFETs with different switching speeds on the same substrate can be challenging.

SUMMARY

In view of the foregoing, disclosed herein are embodiments of a method of forming an integrated circuit (IC) structure with multiple vertical field effect transistors (VFETs) having different gate lengths and, thereby different threshold voltages (Vts) and different switching speeds. In the method, lower source/drain regions are formed on a semiconductor substrate such that semiconductor fins extend vertically above the lower source/drain regions. Lower spacers are formed on the lower source/drain regions and positioned laterally adjacent to the semiconductor fins. Gates, having co-planar top surfaces, are formed on the lower spacers and positioned laterally adjacent to the semiconductor fins. However, prior to gate formation, process steps are perform to ensure that the top surfaces of the lower source/drain region and lower spacer of a first VFET are below the levels of the top surfaces of the lower source/drain region and lower spacer, respectively, of a second VFET. As a result, the first VFET will have a longer gate length, a higher threshold voltage and a slower switching speed than the second VFET. Also disclosed herein are IC structure embodiments formed according to the above-described method embodiments.

More particularly, disclosed herein are embodiments of a method of forming an integrated circuit (IC) structure with multiple vertical field effect transistors (VFETs) (e.g., at least a first VFET and a second VFET). Each of the method embodiments includes forming lower source/drain regions (e.g., a first lower source/drain region for the first VFET and a second lower source/drain region for the second VFET) on a top surface of a semiconductor substrate opposite an essentially planar bottom surface. These lower source/drain regions can specifically be formed such that the height of the top surface of the first lower source/drain region as measured from the planar bottom surface of the semiconductor substrate is less than the height of the top surface of the second lower source/drain region as measured from the planar bottom surface of the semiconductor substrate such that the top surface of the first lower source/drain region is below the level of the top surface of the second lower source/drain region.

For example, some method embodiments can include forming a sacrificial layer on the semiconductor substrate such that the sacrificial layer has a first portion and a second portion and such that the height of the top surface of the first portion of the sacrificial layer as measured from an essentially planar bottom surface of the semiconductor is less than the height of the top surface of the second portion of the sacrificial layer as measured from the planar bottom surface of the semiconductor substrate such that the top surface of the first portion of the sacrificial layer is below the level of the top surface of the second portion. This can be accomplished by recessing a portion of the substrate prior to depositing the sacrificial layer onto the semiconductor substrate. Alternatively, this can be accomplished by recessing a portion of the sacrificial layer after it is deposited. In any case, a semiconductor layer can be deposited onto the sacrificial layer and planarized. Then, the semiconductor layer can be patterned into a first semiconductor fin above the first portion of the sacrificial layer and a second semiconductor fin above the second portion of the sacrificial layer. Since the top surface of the first portion of the sacrificial layer is lower than the top surface of the second portion and since the semiconductor layer was previously planarized so that it has an essentially planar top surface, the first semiconductor fin will be taller than the second semiconductor fin. Subsequently, sidewall spacers can be formed on the first semiconductor fin and the second semiconductor fin and the sacrificial material can be extend to expose the semiconductor substrate.

Once the semiconductor substrate is exposed, a first lower source/drain region can be formed on the semiconductor substrate adjacent to first semiconductor fin and a second lower source/drain region can be formed on the semiconductor substrate adjacent to the second semiconductor fin. These lower source/drain regions can be formed, for example, by epitaxial deposition of semiconductor material (e.g., using a self-limiting epitaxial deposition process) and, as a result, the height of the top surface of the first lower source/drain region as measured from the planar bottom surface of the semiconductor substrate will be less than the height of the top surface of the second lower source/drain region as measured from the planar bottom surface of the semiconductor substrate (i.e., the top surface of the first lower source/drain region will be below the level of the top surface of the second lower source/drain region).

Another method embodiment includes patterning a first semiconductor fin and a second semiconductor fin into an upper portion of a semiconductor substrate. Sidewall spacers can be formed on the first semiconductor fin and the second semiconductor fin and the semiconductor substrate can be isotropically etched. Semiconductor material can then be epitaxially deposited onto a top surface of the semiconductor substrate adjacent to the first semiconductor fin and adjacent to the second semiconductor fin such that the top surface of the semiconductor material is at approximately the same level as the bottom of the sidewall spacers. A first portion of this semiconductor material adjacent to the first semiconductor fin will form the first lower source/drain region and a second portion of the semiconductor material adjacent to the second semiconductor fin will form the second lower source/drain region. After the semiconductor material is deposited, the first portion of the semiconductor material can be recessed relative to the second portion such that the semiconductor material has a recessed first portion (i.e., the first lower source/drain region) adjacent to the first semiconductor fin and an unrecessed second portion (i.e., the second lower source/drain region) adjacent to the second semiconductor fin. As a result, the height of the top surface of the first lower source/drain region as measured from an essentially planar bottom surface of the semiconductor substrate is less than the height of the top surface of the second lower source/drain region as measured from the planar bottom surface of the semiconductor substrate (i.e., the top surface of the first lower source/drain region is below the level of the top surface of the second lower source/drain region).

Each of these method embodiments also includes forming a first vertical field effect transistor (VFET), which incorporates the first lower source/drain region and the first semiconductor fin, and a second VFET, which incorporates the second lower source/drain region and the second semiconductor fin, as discussed above. The disclosed techniques that are used to ensure that the top surface of the first lower source/drain region of the first VFET is below the level of the top surface of the second lower source/drain region of the second VFET allow the first VFET to be formed, during subsequent processing, with a longer gate length, a higher threshold voltage and a slower switching speed than the second VFET.

Also disclosed herein are embodiments of an integrated circuit (IC) structure formed according to the above-described method. Specifically, each embodiment of the IC structure disclosed herein can include a semiconductor substrate and at least two VFETs (i.e., a first VFET and a second VFET) on the substrate. The first VFET can include a first lower source/drain region, which is above and immediately adjacent to a surface of the semiconductor substrate. The second VFET can include a second lower source/drain region, which is also above and immediately adjacent to a surface of the semiconductor substrate. However, a height of the top surface of the first lower source/drain region as measured from an essentially planar bottom surface of the semiconductor substrate is less than the height of the top surface of the second lower source/drain region as measured from the planar bottom surface of the semiconductor substrate. Thus, the top surface of the first lower source/drain region is below the level of the top surface of the second lower source/drain region. This configuration allows the first VFET to be formed with a longer gate length, a higher threshold voltage and a slower switching speed than the second VFET.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 7-8 are cross-section diagrams illustrating partially completed structures formed according to the flow diagram of FIG. 2;

FIG. 10 is a cross-section diagram illustrating a partially completed structure formed according to the flow diagram of FIG. 2;

FIG. 11 is a cross-section diagram illustrating a structure formed according to the flow diagram of FIG. 2;

DETAILED DESCRIPTION

As mentioned above, a vertical field effect transistor (VFET) is a device, which typically incorporates a lower source/drain region in a substrate, a semiconductor fin that extends upward from the lower source/drain region, and an upper source/drain region that is epitaxially grown on the top surface of the semiconductor fin. A gate (e.g., a metal gate) laterally surrounds the semiconductor fin, which functions as the channel region. The gate is electrically isolated from the lower source/drain region and the upper source/drain region by lower and upper spacer layers, respectively. However, while multiple essentially identical VFETs can easily be produced on a substrate with minimal impact on manufacturing efficiency and costs, oftentimes IC designs require devices with different switching speeds (e.g., due to different threshold voltages (Vts)), forming VFETs with different switching speeds on the same substrate can be challenging.

In view of the foregoing, disclosed herein are embodiments of a method of forming an integrated circuit (IC) structure with multiple vertical field effect transistors (VFETs) having different gate lengths and, thereby different threshold voltages (Vts) and different switching speeds. In the method, lower source/drain regions are formed on a semiconductor substrate such that semiconductor fins extend vertically above the lower source/drain regions. Lower spacers are formed on the lower source/drain regions and positioned laterally adjacent to the semiconductor fins. Gates, having co-planar top surfaces, are formed on the lower spacers and positioned laterally adjacent to the semiconductor fins. However, prior to gate formation, process steps are performed to ensure that the top surfaces of the lower source/drain region and lower spacer of a first VFET are below the levels of the top surfaces of the lower source/drain region and lower spacer, respectively, of a second VFET. As a result, the first VFET will have a longer gate length, a higher threshold voltage and a slower switching speed than the second VFET. Also disclosed herein are IC structure embodiments formed according to the above-described method embodiments.

Figure 1:
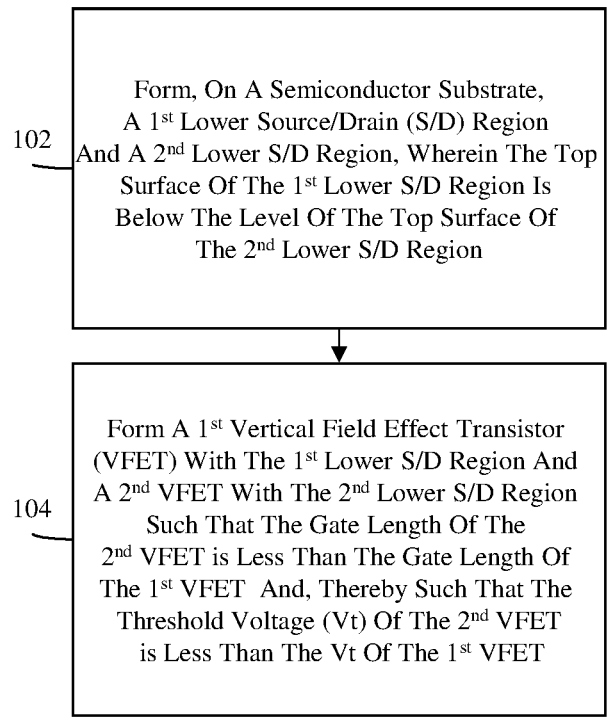
FIG. 1 is a flow diagram generally illustrating the disclosed embodiments of a method of forming an integrated circuit (IC) structure with multiple vertical field effect transistors (VFETs) having different gate lengths and, thereby different threshold voltages (Vts) and different switching speeds.

Specifically, referring to the flow diagram of FIG. 1, generally disclosed herein are embodiments of a method of forming an integrated circuit (IC) structure with multiple vertical field effect transistors (VFETs) having different gate lengths and, thereby different threshold voltages (Vts) and different switching speeds.

Each of the method embodiments includes forming, on a semiconductor substrate, a first lower source/drain region and a second lower source/drain region (see process 102). These lower source/drain regions (e.g., a first lower source/drain region for the first VFET and a second lower source/drain region for the second VFET) can be formed at process 102 on a top surface of the semiconductor substrate opposite an essentially planar bottom surface and they can specifically be formed such that the height of the top surface of the first lower source/drain region as measured from the planar bottom surface of the semiconductor substrate is less than the height of the top surface of the second lower source/drain region as measured from the planar bottom surface of the semiconductor substrate (i.e., such that the top surface of the first lower source/drain region is below the level of the top surface of the second lower source/drain region.

Each of the method embodiments can further include forming a first vertical field effect transistor (VFET), which incorporates the first lower source/drain region, and a second VFET, which incorporates the second lower source/drain region (see process 104). Specifically, the first VFET can be formed so that it further includes: a first semiconductor fin that extends vertically above the first lower source/drain region; a first lower spacer above the first lower source/drain region and positioned laterally adjacent to the first semiconductor fin; a first gate above the first lower spacer and positioned laterally adjacent to the first semiconductor fin; a first upper spacer above the first gate and positioned laterally adjacent to the first semiconductor fin; and a first upper source/drain region above the first upper spacer and immediately adjacent to a first top of the first semiconductor fin. Similarly, the second VFET can be formed so that it includes: a second semiconductor fin, which extends vertically above the second lower source/drain region; a second lower spacer above the second lower source/drain region and positioned laterally adjacent to the second semiconductor fin; a second gate above the second lower spacer, positioned laterally adjacent to the second semiconductor fin and, optionally, electrically isolated from the first gate by an additional isolation region; a second upper spacer above the second gate and positioned laterally adjacent to the second semiconductor fin; and a second upper source/drain region above the second upper spacer and immediately adjacent to a second top of the second semiconductor fin. Formation of the first VFET and the second VFET at process 104 can specifically be performed such that the top surface of the first lower spacer of the first VFET is below the level of the top surface of a second lower spacer of the second VFET and such the first gate of the first VFET and the second gate of the second VFET have co-planar top surfaces. As a result, the first gate of the first VFET will have a first gate length and the second gate of the second VFET will have a second gate length that is less than the first gate length. Due to the longer first gate length, the first VFET will have a higher threshold voltage and, thereby a slower switching speed than the second VFET.

The different method embodiments disclosed herein use different techniques to ensure that the top surface of the first lower source/drain region is below the level of the top surface of the second lower source/drain region.

Figure 2:
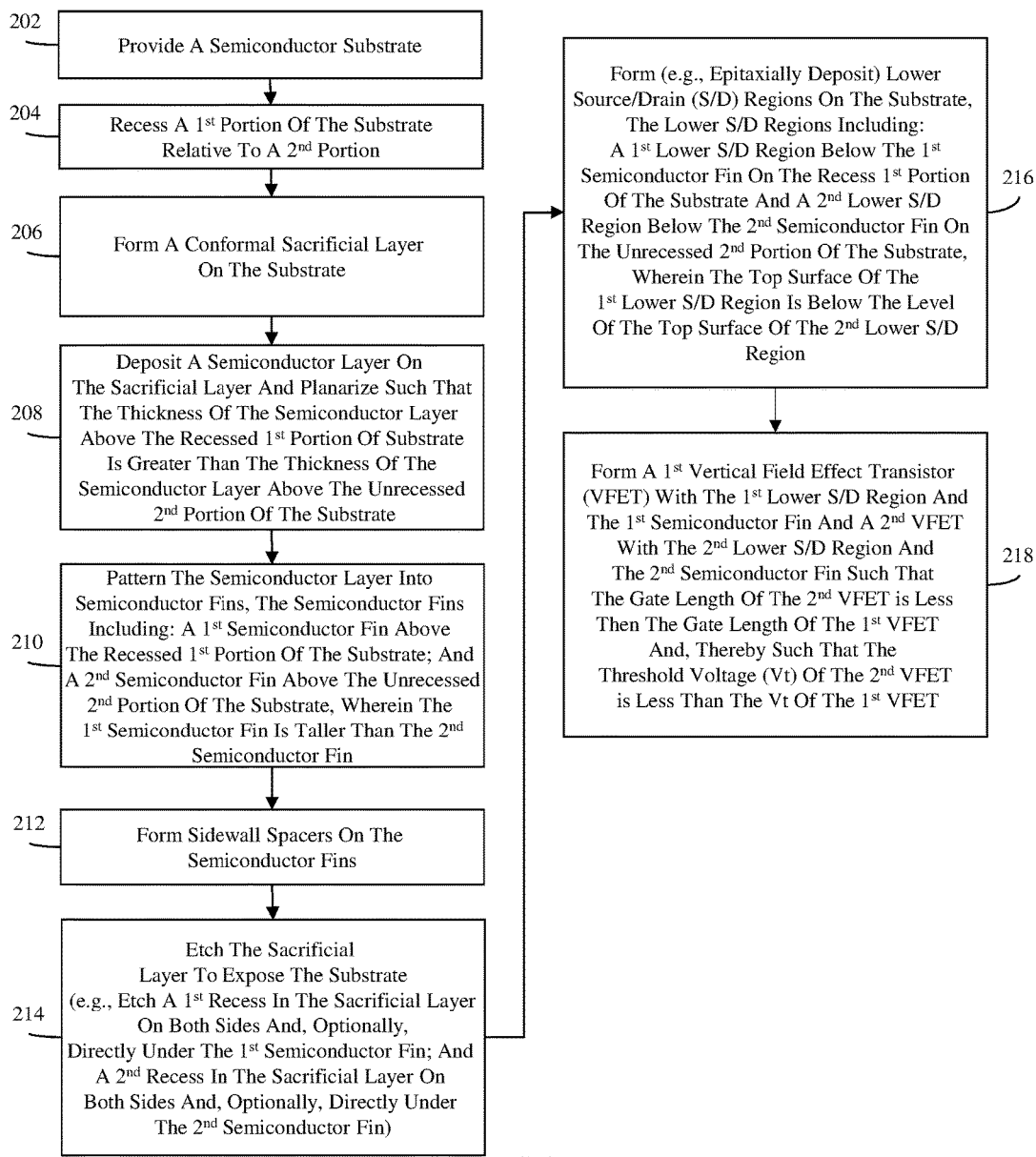
FIG. 2 is a flow diagram illustrating one embodiment of the method.
Figure 3:
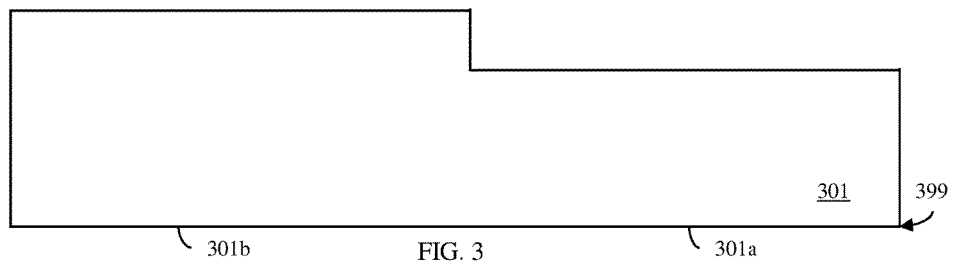
FIGS. 3-5 are cross-section diagrams illustrating partially completed structures formed according to the flow diagram of FIG. 2.

For example, referring to the flow diagram of FIG. 2, one method embodiment can include providing a semiconductor substrate 301 (see process 202 and FIG. 3). The semiconductor substrate 301 can, for example, be a bulk semiconductor substrate such as a bulk silicon substrate. The semiconductor substrate 301 can initially have an essentially planar bottom surface 399 and an essentially planar top surface opposite the planar bottom surface.

A first portion of this semiconductor substrate, upon which a first VFET will be formed, can be recessed relative to a second portion, upon which a second VFET will be formed (see process 204 and FIG. 3). Thus, following process 204, the semiconductor substrate will have a recessed first portion 301a and an unrecessed second portion 301b. Specifically, a mask can be formed (e.g., lithographically patterned and etched) on the top surface of the semiconductor substrate such that the first portion remains exposed and such that the second portion is covered (i.e., masked or protected). Then, an anisotropic etch process can be performed so as to recess the top surface of the semiconductor substrate in the first portion (i.e., to etch back or lower the top surface of the first area) so that the semiconductor substrate has the recessed first portion 301a and the unrecessed second portion 301b. Thus, after process 204, the top surface of the semiconductor substrate will be tiered as opposed to planar. After recessing the first portion, the mask can be selectively removed.

Figure 4:
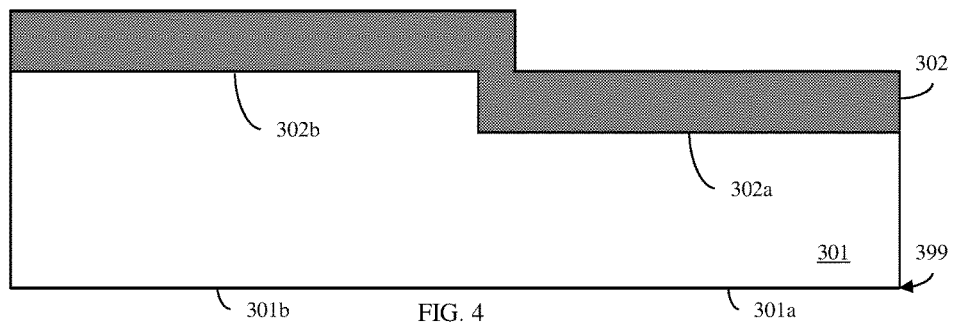

A sacrificial layer 302 can then be deposited onto the top surface of the semiconductor substrate 301 such that the sacrificial layer 302 has a first portion 302a, which is on the recessed first portion 301a of the semiconductor substrate, and a second portion 302b, which is on the unrecessed second portion 301b of the semiconductor substrate (see process 206 and FIG. 4). The sacrificial layer 302 can be essentially conformally deposited so as to have an essentially uniform thickness. Given the tiered top surface of the semiconductor substrate, the height of the top surface of the first portion 302a of the sacrificial layer as measured from the planar bottom surface 399 of the semiconductor substrate will be less than the height of the top surface of the second portion 302b of the sacrificial layer as measured from the planar bottom surface 399 of the semiconductor substrate (i.e., the top surface of the first portion 302a of the sacrificial layer will be below the level of the top surface of the second portion 302b of the sacrificial layer). The sacrificial layer 302 can, for example, be a monocrystalline semiconductor material that is epitaxially deposited onto the semiconductor substrate and that is different from the semiconductor substrate. For example, the sacrificial layer 302 can be an epitaxial layer of monocrystalline silicon germanium, carbon-doped silicon germanium or carbon and boron-doped silicon germanium.

Figure 5:
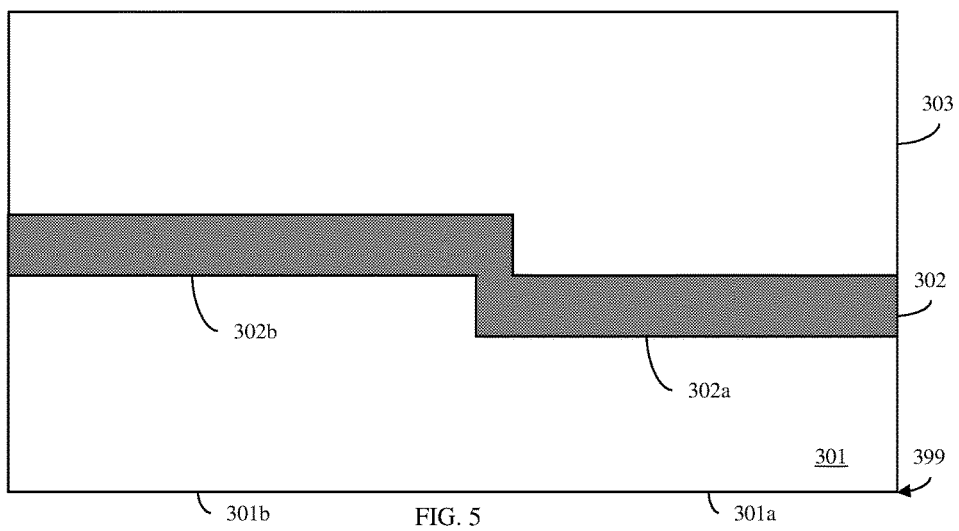

A semiconductor layer 303 can then be deposited onto the sacrificial layer 302 (see process 208 and FIG. 5). Following deposition, this semiconductor layer 303 can be planarized (i.e., polished) using, for example, a chemical mechanical polishing (CMP) process such that, even though the sacrificial layer 302 below is tiered, the semiconductor layer 303 will have an essentially planar top surface. As a result, the portion of the semiconductor layer 303 above the first portion 302a of the sacrificial layer will have a first thickness and the portion of the semiconductor layer above the second portion 302b of the sacrificial layer will have a second thickness that is less than the first thickness. This semiconductor layer 303 can, for example, be a monocrystalline semiconductor material that is epitaxially deposited onto the sacrificial layer 302 and that is different from the sacrificial layer 302 such that the sacrificial layer 302 can function as an etch stop layer during subsequent processing. For example, the semiconductor layer 303 can be a silicon layer.

Figure 6A:
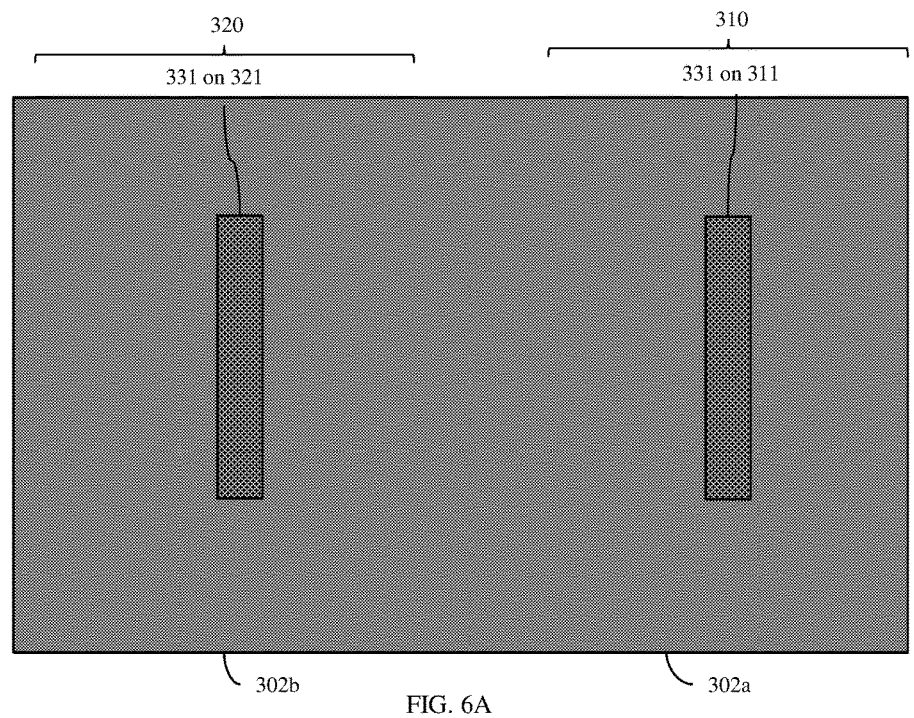
FIGS. 6A and 6B are top view and cross-section diagrams, respectively, illustrating a partially completed structure formed according to the flow diagram of FIG. 2.
Figure 6B:
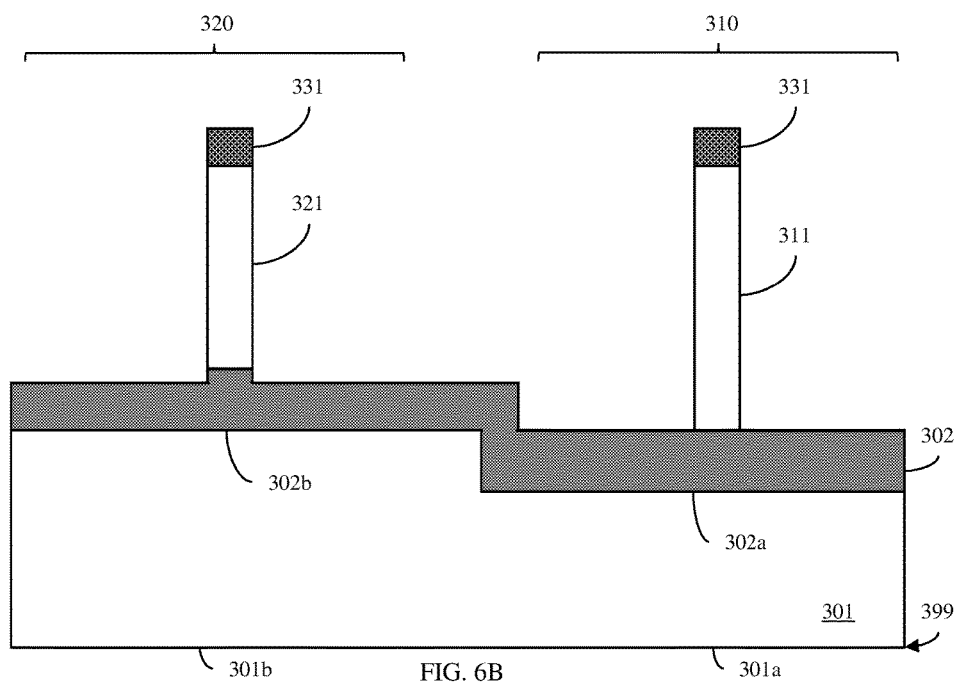

A dielectric hardmask layer can be formed on the semiconductor layer 303 and the hardmask and semiconductor layers can be patterned into multiple capped semiconductor fins (see process 210 and FIGS. 6A and 6B). The dielectric hardmask layer can be made, for example, of silicon nitride or any other suitable dielectric hardmask material. Techniques for patterning fins (e.g., conventional lithographic patterning techniques, sidewall image transfer patterning techniques, etc.) are well known in the art and, thus, the details have been omitted from the specification in order to allow the reader to focus on the salient aspects of the disclosed embodiments.

For purposes of this disclosure, a fin refers to a tall, relatively thin, essentially rectangular shaped body. However, it should be understood that, depending upon the etch processes used to form the fins, the sidewalls of the fins may not be perfectly vertical (i.e., perpendicular relative to the bottom surface of the semiconductor substrate). That is, the sidewalls may taper slightly from top to bottom or vice versa, they may curve slightly, etc.

In any case, this patterning process 210 can be performed so as to form at least one first semiconductor fin 311, having a dielectric cap 331, above and immediately adjacent to the first portion 302a of the sacrificial layer (and, thereby above the recessed first portion 301a of the semiconductor substrate) and at least one second semiconductor fin 321, having a dielectric cap 331, above and immediately adjacent to the second portion 302b of the sacrificial layer (and, thereby above the unrecessed second portion 301b of the semiconductor substrate). For purposes of illustration, only a single first semiconductor fin 311 and a single second semiconductor fin 321 are shown. However, those skilled in the art will recognize that a VFET may incorporate multiple semiconductor fins. Thus, alternatively, any number of one or more first semiconductor fins and one or more second semiconductor fins could be patterned into the semiconductor layer at process 210 and used to form the first VFET and the second VFET, respectively.

As illustrated in FIG. 5, since the semiconductor layer 303 is thicker above the first portion 302a of the sacrificial layer than it is above the second portion 302b, the first semiconductor fin 311 will be taller than the second semiconductor fin 321. That is, the first semiconductor fin 311 will have a first fin height, as measured from the top surface of the first portion 302a of the sacrificial layer and the second semiconductor fin 321 will have a second fin height that is less than the first height, as measured from the top surface of the second portion 302b of the sacrificial layer.

It should be noted that, at process 210, the sacrificial layer 302 will function as an etch stop layer. However, since the portion of the semiconductor layer above the second portion 302b of the sacrificial layer is thinner than the portion of the semiconductor layer above the first portion 302a, the top surface of the second portion 302b will be exposed after etching of the second semiconductor fin is finished and while etching of the first semiconductor fin is being completed. Since, given the different materials used for the semiconductor layer and the sacrificial layer and the etch specifications, etch selectivity may not be absolute, some etching back of the second portion 302b of the sacrificial layer may occur, as illustrated.

Dielectric sidewall spacers 332 can then be formed on the sidewalls of the first semiconductor fin 311 and the second semiconductor fin 321 (see process 212 and FIG. 7). Specifically, a dielectric sidewall spacer material can be conformally deposited over the semiconductor fins 311 and 321. This dielectric sidewall spacer material can be, for example, silicon oxycarbide (SiOC), silicon oxycarbonitride (SiOCN), or any other suitable dielectric sidewall spacer material that is different from the dielectric material used for the dielectric caps 331. Then, a selective anisotropic etch process can be performed so as to remove this material from horizontal surfaces of the partially completed structure, leaving the sidewalls of each semiconductor fin protected by a sidewall spacer 332 and dielectric cap 331. Additionally, at this point in the processing, a trench isolation region 333 can also be formed at the interface between the first portion 302a and the second portion 302b of the sacrificial layer. This trench isolation region 333 can include, for example, a trench, which extends essentially vertically through the sacrificial layer 302 and into the semiconductor substrate 301 and which is filled with a dielectric material, such as silicon dioxide or any other suitable dielectric material suitable for isolation region formation. Techniques for forming trench isolation regions are well known in the art and, thus, the details have been omitted from this specification in order to allow the reader to focus on the salient aspects of the disclosed embodiments.

Subsequently, the sacrificial layer can be etched to expose the top surfaces of the unrecessed first portion 301a and the recessed second portion 301b of the semiconductor substrate (see process 214). Specifically, the first portion 302a of the sacrificial layer around the first semiconductor fin 311 (i.e., adjacent to the sides and ends of the first semiconductor fin 311) and the second portion 302b of the sacrificial layer around the second semiconductor fin 321 (i.e., adjacent to the sides and ends of the second semiconductor fin 321) can be etched away using a selective etch process (see FIG. 8). This selective etch process can be selective for the semiconductor material of the sacrificial layer 302 over the semiconductor material of the semiconductor substrate 301. Thus, etching will stop at the top surfaces of the recessed first portion 301a and the unrecessed second portion 301b of the semiconductor substrate 301. This selective etch process can also be selective for the semiconductor material of the sacrificial layer 302 over the dielectric materials of the trench isolation region 333, the sidewall spacers 332 and the dielectric caps 331.

Figure 9A:
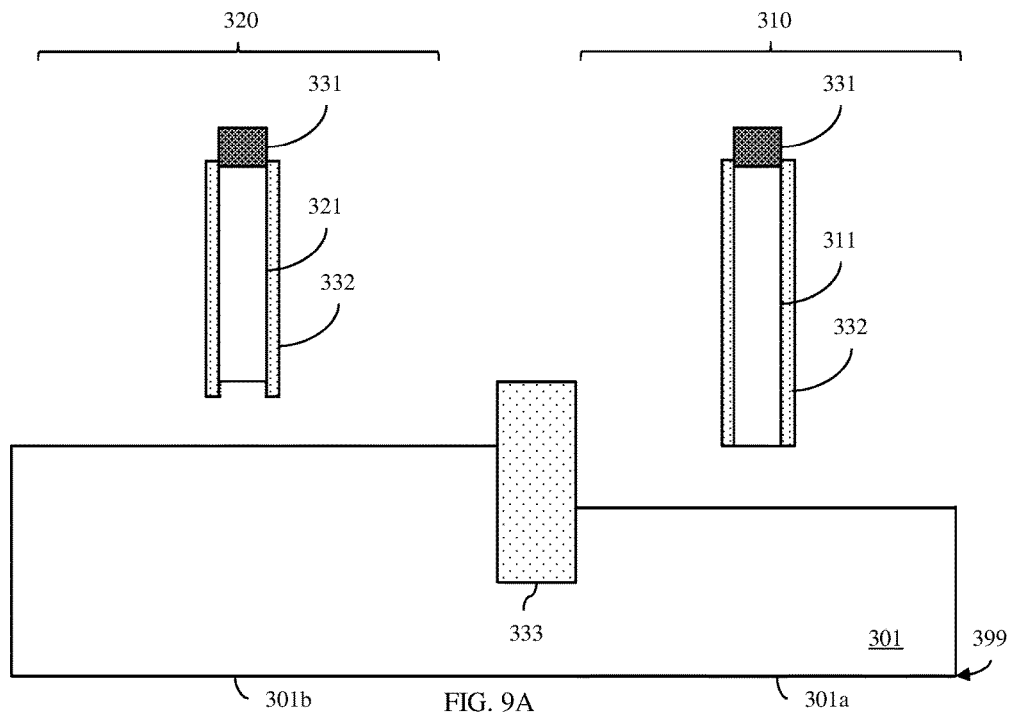
FIGS. 9A and 9B are different cross-section diagrams illustrating a partially completed structure formed according to the flow diagram of FIG. 2.
Figure 9B:
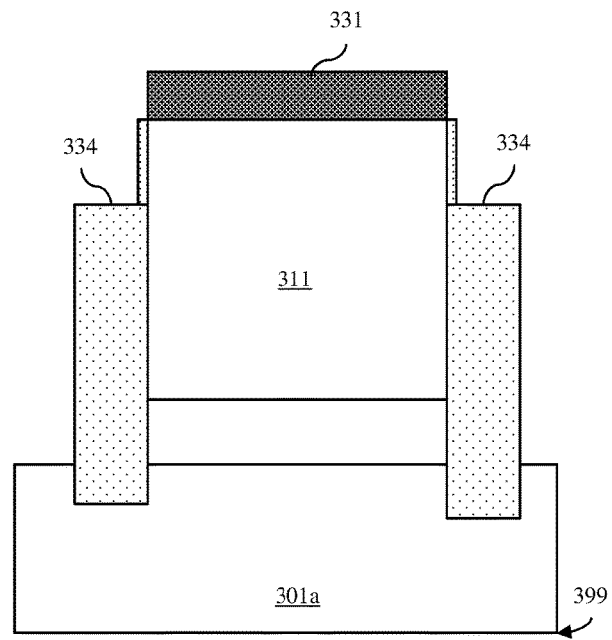

It should be noted that the selective etch process used to etch the sacrificial layer at process 214 can be an anisotropic etch process such that, as illustrated in FIG. 8, fin-shaped sections of the sacrificial material and, particularly, of the first portion 302a and the second portion 302b remain aligned below the first semiconductor fin 311 and the second semiconductor fin 321, respectively. Absent some other supporting structure, the fin-shaped sections shown in FIG. 8 are necessary to support the first semiconductor fin 311 and the second semiconductor fin 321 (i.e., to prevent collapse of the first semiconductor fin 311 and the second semiconductor fin 321). However, optionally, processing can include the formation of support structures (also referred to herein as anchor regions) that are attached to the semiconductor fins, that extend vertically through the sacrificial layer to the substrate and that will support the semiconductor fins during source/drain recess formation. In this case, the selective etch process used to etch the sacrificial layer can be an isotropic etch process that completely removes the first portion 302a of the sacrificial layer from below the first semiconductor fin 311 and completely removes the second portion 302b of the sacrificial layer from below the second semiconductor fin 321 because the anchor regions will provide the necessary support for the first semiconductor fin 311 and the second semiconductor fin 321. Any number of various different techniques could be used to form support structures suitable for supporting the semiconductor fins during source/drain recess formation when the material below the semiconductor fins is removed. For example, anchor regions 334 could be formed at the opposing ends of each of the semiconductor fins (e.g., see the anchor regions 334 at the opposing ends of the first semiconductor fin 311 in FIGS. 9A-9B). In this case, the anchor regions 334 are formed as trenches at the opposing ends of the semiconductor fins, that extend vertically through the sacrificial layer and into the semiconductor substrate and that are filled with isolation material such that the isolation material forms pillars attached to the opposing ends of the semiconductor fins and based in the substrate. Alternatively, any other technique could be used to form anchor regions (i.e., support structures) that are attached to the semiconductor fins, that extend vertically through the sacrificial layer to the substrate and that are suitable for supporting the semiconductor fins when the material below the semiconductor fins is removed. Such techniques are well known in the art and, thus, the details have been omitted from the specification in order to allow the reader to focus on the salient aspects of the disclosed method. As discussed below, these supporting structures (e.g., anchor regions 334) can be selectively removed prior to gate formation.

For purposes of illustration, the remaining process steps of this embodiment of the method are illustrated in the drawings with respect to the partially completed structure shown in FIG. 8. However, it should be understood that, alternatively, these same processes could be performed with respect to the partially completed structure shown in FIG. 9B or any other partially completed structure having anchor regions, as discussed above.

Next, a first lower source/drain region 313 can be formed on the recessed first portion 301a of the semiconductor substrate adjacent to the first semiconductor fin 311 and a second lower source/drain region 323 can be formed on the unrecessed second portion 301b of the semiconductor substrate 301 adjacent to the second semiconductor fin 321 (see process 216 and FIG. 10). These lower source/drain regions 313, 323 can be formed, for example, by epitaxially depositing semiconductor material onto the semiconductor substrate surface using, for example, a self-limiting process. As a result, the top surface 314 of the first lower source/drain region 313 will be at approximately the same level as the bottom of the sidewall spacer 332 on the first semiconductor fin 311 and the top surface 324 of the second lower source/drain region 323 will be at approximately the same level as the bottom of the sidewall spacer 332 on the second semiconductor fin 321. Thus, the top surface 314 of the first lower source/drain region 313 will be below the level of the top surface 324 of the second lower source/drain region 323. That is, the height of the top surface 314 of the first lower source/drain region 313 as measured from the planar bottom surface 399 of the semiconductor substrate 301 will be less than the height of the top surface 324 of the second lower source/drain region 323 as measured from the planar bottom surface 399 of the semiconductor substrate (i.e., the top surface of the first lower source/drain region will be below the level of the top surface of the second lower source/drain region).

It should be noted that this semiconductor material can be in situ doped and can be, for example, silicon or some other semiconductor material suitable for source/drain region formation. In the case where fin-shaped sections of the sacrificial layer and, particularly, of portions 302a and 302b remain directly under the semiconductor fins 311 and 321, respectively, a subsequently performed dopant activation anneal can cause dopants from the in-situ doped semiconductor material to diffuse into the fin-shaped sections so to incorporate those fin-shaped sections into the lower source/drain regions. In the case where supporting structures (i.e., anchor regions) are used to provide support for the first semiconductor fin and the second semiconductor fin, those anchor regions can be selectively removed following formation of the first lower source/drain region and the second lower source/drain region.

This method embodiment can further include removing the dielectric sidewall spacers and forming a first vertical field effect transistor (VFET) 310 with the first lower source/drain region 313 and the first semiconductor fin 311 and a second VFET 320 with the second lower source/drain region 323 and the second semiconductor fin 321 (see process 218 and the structure embodiment 300 shown in FIG. 11). Specifically, the first VFET 310 can be formed so that it further includes: a first lower spacer 315 above the first lower source/drain region 313 and positioned laterally adjacent to the first semiconductor fin 311; a first gate 316 above the first lower spacer 315 and positioned laterally adjacent to the first semiconductor fin 311; a first upper spacer 318 above the first gate 316 and positioned laterally adjacent to the first semiconductor fin 311; and a first upper source/drain region 319 above the first upper spacer 318 and immediately adjacent to a first top of the first semiconductor fin 311. Similarly, the second VFET 320 can be formed so that it includes: a second lower spacer 325 above the second lower source/drain region 323 and positioned laterally adjacent to the second semiconductor fin 321; a second gate 326 above the second lower spacer 325, positioned laterally adjacent to the second semiconductor fin 321 and, optionally, electrically isolated from the first gate by an additional isolation region 336; a second upper spacer 328 above the second gate 326 and positioned laterally adjacent to the second semiconductor fin 321; and a second upper source/drain region 329 above the second upper spacer 328 and immediately adjacent to a second top of the second semiconductor fin 321.

The first VFET 310 and the second VFET 320 can specifically be formed at process 218 such that the top surface of the first lower spacer 315 is below the level of the top surface of the second lower spacer 325 (e.g., so that the first lower spacer 315 and the second lower spacer 325 have approximately equal thicknesses) and such the first gate 316 and the second gate 326 have co-planar top surfaces. As a result, the first gate 316 of the first VFET 310 will have a first gate length 317 and the second gate 326 of the second VFET 320 will have a second gate length 327 that is less than the first gate length 317. Due to the longer first gate length, the first VFET 310 will have a higher threshold voltage and, thereby a slower switching speed than the second VFET 320.

Figure 12:
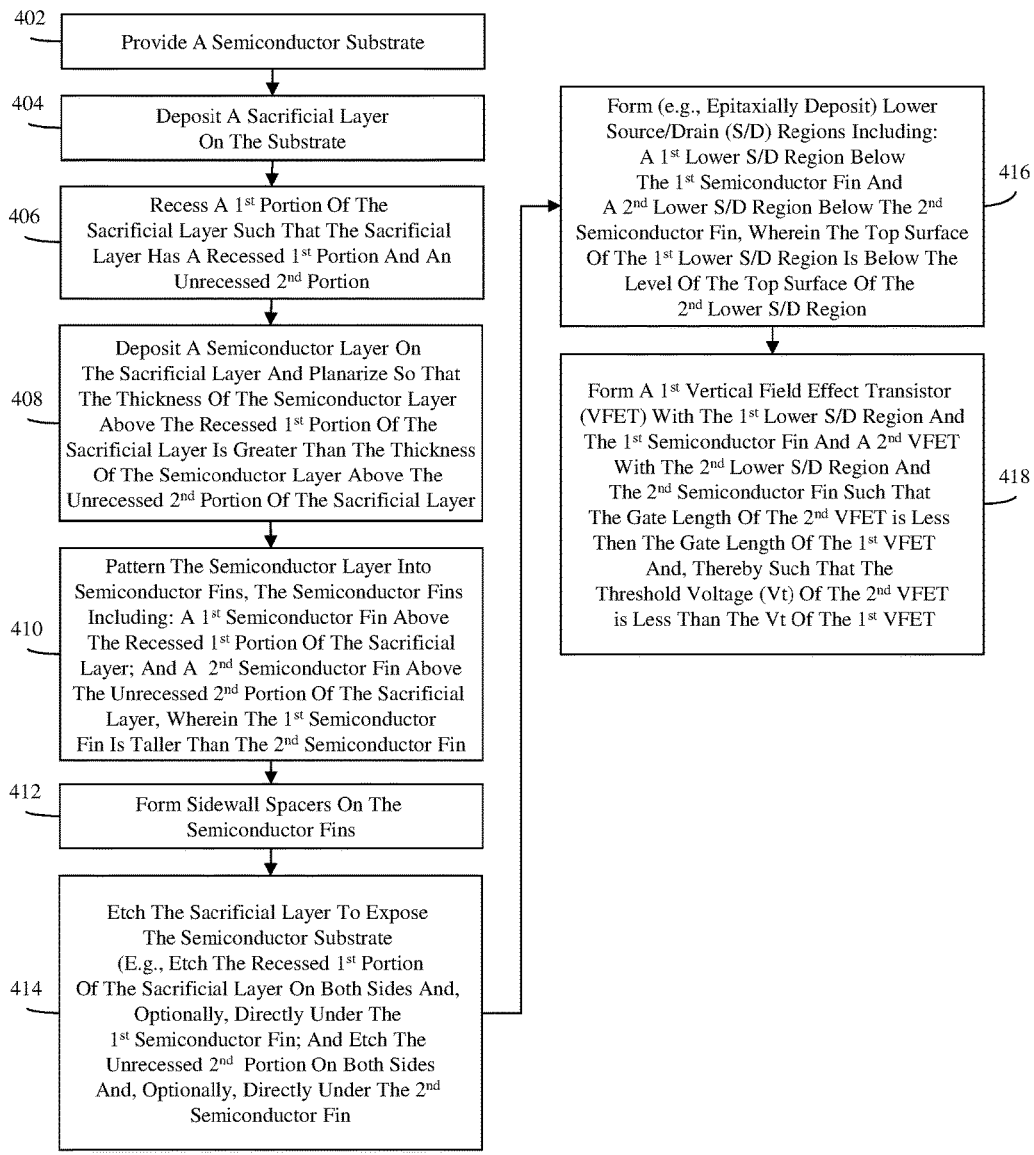
FIG. 12 is a flow diagram illustrating another embodiment of the method.
Figure 13:
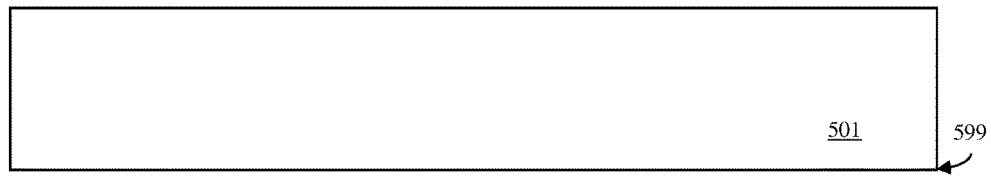
FIGS. 13-15 are cross-section diagrams illustrating partially completed structures formed according to the flow diagram of FIG. 12.

Referring to the flow diagram of FIG. 12, another method embodiment can include providing a semiconductor substrate 501 (see process 402 and FIG. 13). The semiconductor substrate 501 can, for example, be a bulk semiconductor substrate such as a bulk silicon substrate. The semiconductor substrate 501 can have an essentially planar bottom surface 599 and an essentially planar top surface opposite the planar bottom surface.

Figure 14:
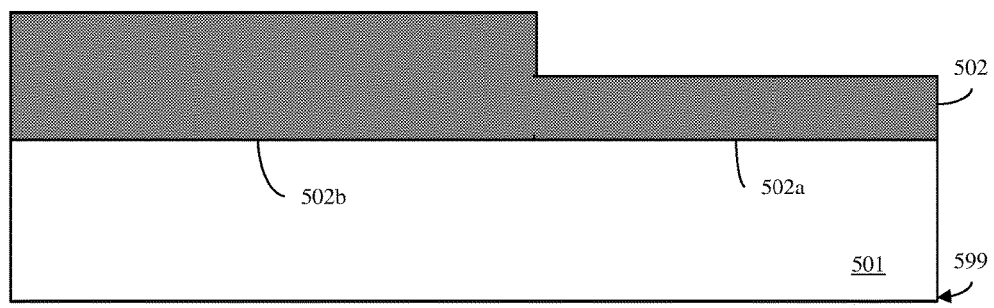

A sacrificial layer 502 can be deposited onto the essentially planar top surface of the semiconductor substrate 501 and a first portion of this sacrificial layer 502 can be recessed relative to a second portion such that the sacrificial layer has a recessed first portion 502a and an unrecessed second portion 502b (see processes 404-406 and FIG. 14). Specifically, the sacrificial layer 502 can, for example, be a monocrystalline semiconductor material that is epitaxially deposited onto the semiconductor substrate and that is different from the semiconductor substrate. For example, the sacrificial layer 502 can be an epitaxial layer of monocrystalline silicon germanium, carbon-doped silicon germanium or carbon and boron-doped silicon germanium. A mask can be formed (e.g., lithographically patterned and etched) on the top surface of the sacrificial layer such that the first portion remains exposed and such that the second portion is covered (i.e., masked or protected). An anisotropic etch process can be performed so as to recess the first portion relative to the second portion. That is, the anisotropic etch process forms a recess in the sacrificial layer such that the sacrificial layer will have a recessed first portion 502a, which will be relatively thin, and an unrecessed second portion 502b, which will be relatively thick. Thus, the height of the top surface of the unrecessed first portion 502a of the sacrificial layer as measured from the planar bottom surface 599 of the semiconductor substrate 501 will be less than the height of the top surface of the unrecessed second portion 502b of the sacrificial layer as measured from the planar bottom surface 599 of the semiconductor substrate (i.e., the top surface of the recessed first portion 502a of the sacrificial layer will be below the level of the top surface of the unrecessed second portion 502b). It should be noted that the depth of this recess should still be less than the full thickness of the sacrificial layer. In other words, the anisotropic etch process should be stopped prior to complete removal of the first portion 502a of the sacrificial layer and exposure of the top surface of the substrate 501. The mask can then be selectively removed.

Figure 15:
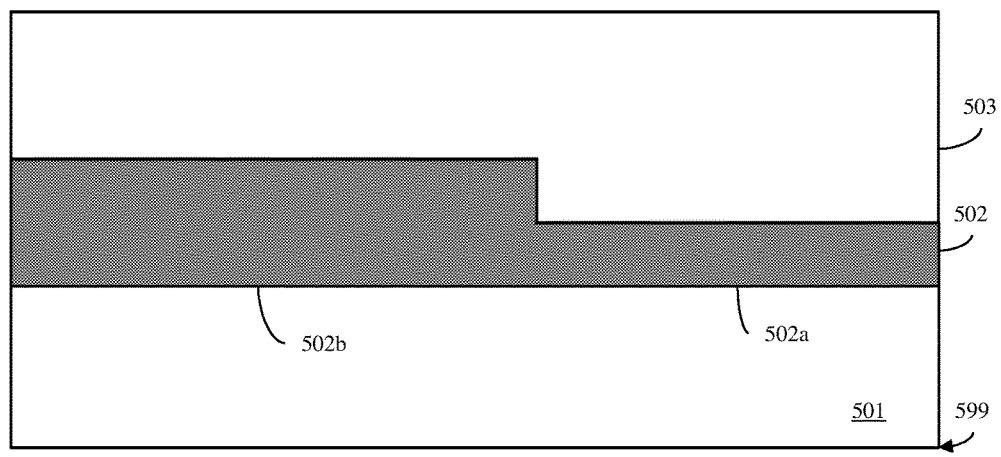

A semiconductor layer 503 can then be deposited onto the sacrificial layer 502 (see process 408 and FIG. 15). Following deposition, this semiconductor layer 503 can be planarized (i.e., polished) using, for example, a chemical mechanical polishing (CMP) process such that, even though the sacrificial layer 502 below is tiered, the semiconductor layer 503 will have an essentially planar top surface. As a result, the portion of the semiconductor layer 503 above the recessed first portion 502a of the sacrificial layer will have a first thickness and the portion of the semiconductor layer above the unrecessed second portion 502b of the sacrificial layer will have a second thickness that is less than the first thickness. This semiconductor layer 503 can, for example, be a monocrystalline semiconductor material that is epitaxially deposited onto the sacrificial layer 502 and that is different from the sacrificial layer 502 such that the sacrificial layer 502 can function as an etch stop layer during subsequent processing. For example, the semiconductor layer 503 can be a silicon layer.

Figure 16A:
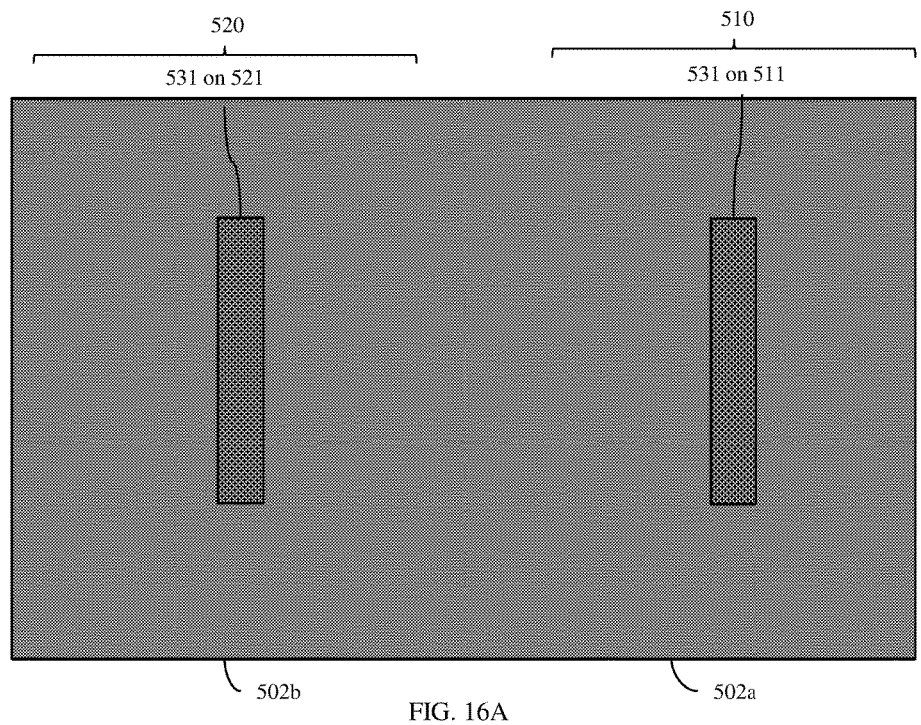
FIGS. 16A and 16B are top view and cross-section diagrams, respectively, illustrating a partially completed structure formed according to the flow diagram of FIG. 21.
Figure 16B:
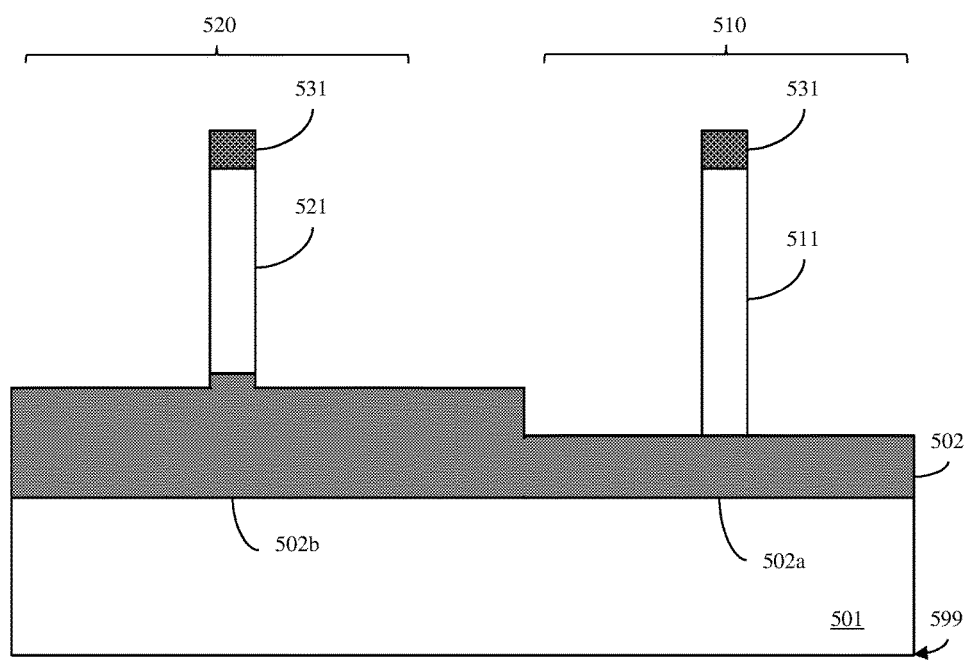

A dielectric hardmask layer can be formed on the semiconductor layer 503 and the hardmask and semiconductor layers can be patterned into multiple capped semiconductor fins (see process 410 and FIGS. 16A and 16B). The dielectric hardmask layer can be made, for example, of silicon nitride or any other suitable dielectric hardmask material. Techniques for patterning fins (e.g., conventional lithographic patterning techniques, sidewall image transfer patterning techniques, etc.) are well known in the art and, thus, the details have been omitted from the specification in order to allow the reader to focus on the salient aspects of the disclosed embodiments.

For purposes of this disclosure, a fin refers to a tall, relatively thin, essentially rectangular shaped body. However, it should be understood that, depending upon the etch processes used to form the fins, the sidewalls of the fins may not be perfectly vertical (i.e., perpendicular relative to the bottom surface of the semiconductor substrate). That is, the sidewalls may taper slightly from top to bottom or vice versa, they may curve slightly, etc.

In any case, this patterning process 410 can be performed so as to form at least one first semiconductor fin 511, having a dielectric cap 531, above and immediately adjacent to the recessed first portion 502a of the sacrificial layer and at least one second semiconductor fin 521, having a dielectric cap 531, above and immediately adjacent to the unrecessed second portion 502b of the sacrificial layer. For purposes of illustration, only a single first semiconductor fin 511 and a single second semiconductor fin 521 are shown. However, those skilled in the art will recognize that a VFET may incorporate multiple semiconductor fins. Thus, alternatively, any number of one or more first semiconductor fins and one or more second semiconductor fins could be patterned into the semiconductor layer at process 410 and used to form the first VFET and the second VFET, respectively.

As illustrated in FIG. 15, since the semiconductor layer 503 is thicker above the recessed first portion 502a of the sacrificial layer than it is above the unrecessed second portion 502b, the first semiconductor fin 511 will be taller than the second semiconductor fin 521. That is, the first semiconductor fin 511 will have a first fin height, as measured from the top surface of the recessed first portion 502a of the sacrificial layer and the second semiconductor fin 521 will have a second fin height that is less than the first height, as measured from the top surface of the unrecessed second portion 502b of the sacrificial layer.

It should be noted that, at process 410, the sacrificial layer 502 will function as an etch stop layer. However, since the portion of the semiconductor layer above the second portion 502b of the sacrificial layer is thinner than the portion of the semiconductor layer above the first portion 502a, the top surface of the second portion 502b will be exposed after etching of the second semiconductor fin is finished and while etching of the first semiconductor fin is being completed. Since, given the different materials used for the semiconductor layer and the sacrificial layer and the etch specifications, etch selectivity may not be absolute, some etching back of the second portion 502b of the sacrificial layer may occur, as illustrated.

Figure 17:
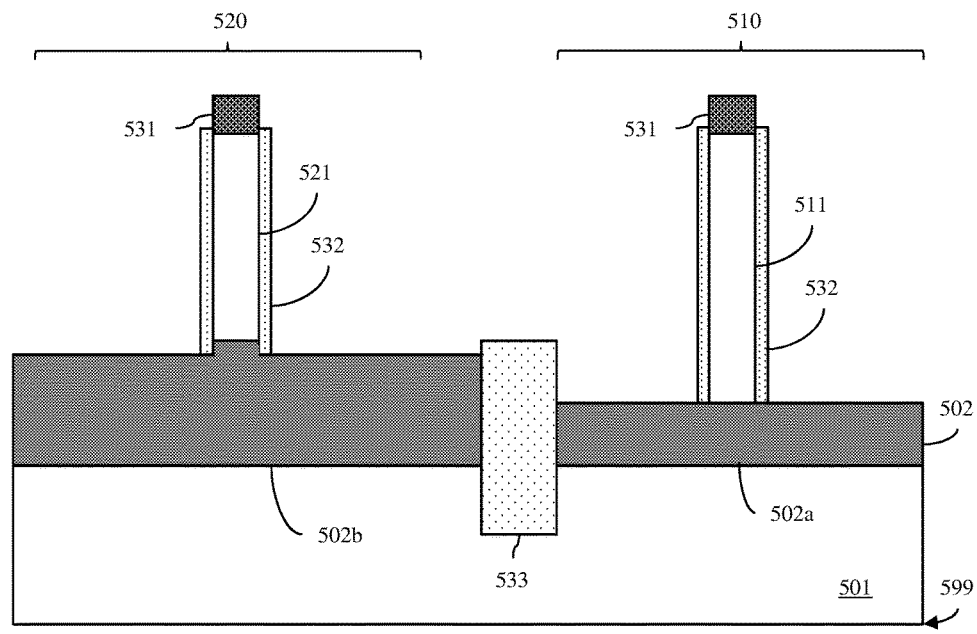
FIGS. 17-18 are cross-section diagrams illustrating partially completed structures formed according to the flow diagram of FIG. 12.

Dielectric sidewall spacers 532 can be formed on the sidewalls of the first semiconductor fin 511 and the second semiconductor fin 521 (see process 412 and FIG. 17). Specifically, a dielectric sidewall spacer material can be conformally deposited over the semiconductor fins. The dielectric sidewall spacer material can be, for example, silicon oxycarbide (SiOC), silicon oxycarbonitride (SiOCN), or any other suitable dielectric sidewall spacer material that is different from the dielectric material used for the dielectric caps 531. Then, a selective anisotropic etch process can be performed so as to remove this material from horizontal surfaces of the partially completed structure, leaving the sidewalls of each semiconductor fin protected by a sidewall spacer 532 and dielectric cap 531. Additionally, at this point in the processing, a trench isolation region 533 can also be formed at the interface between the first portion 502a and the second portion 502b of the sacrificial layer. This trench isolation region 533 can include, for example, a trench, which extends essentially vertically through the sacrificial layer 502 and into the semiconductor substrate 501 and which is filled with a dielectric material, such as silicon dioxide or any other suitable dielectric material suitable for isolation region formation. Techniques for forming trench isolation regions are well known in the art and, thus, the details have been omitted from this specification in order to allow the reader to focus on the salient aspects of the disclosed embodiments.

Subsequently, the sacrificial layer can be etched to expose the semiconductor substrate below (see process 414). Specifically, the recessed first portion 502a of the sacrificial layer around the first semiconductor fin 511 (i.e., adjacent to the sides and ends of the first semiconductor fin 511) and the unrecessed second portion 502b of the sacrificial layer around the second semiconductor fin 521 (i.e., adjacent to the sides and ends of the second semiconductor fin 521) can be etched away using a selective etch process (see FIG. 18). This selective etch process can be selective for the semiconductor material of the sacrificial layer 502 over the semiconductor material of the semiconductor substrate 501. Thus, etching will stop at the top surface of the semiconductor substrate 501. This selective etch process can also be selective for the semiconductor material of the sacrificial layer 502 over the dielectric materials of the trench isolation region 533, the sidewall spacers 532 and the dielectric caps 531.

Figure 18:
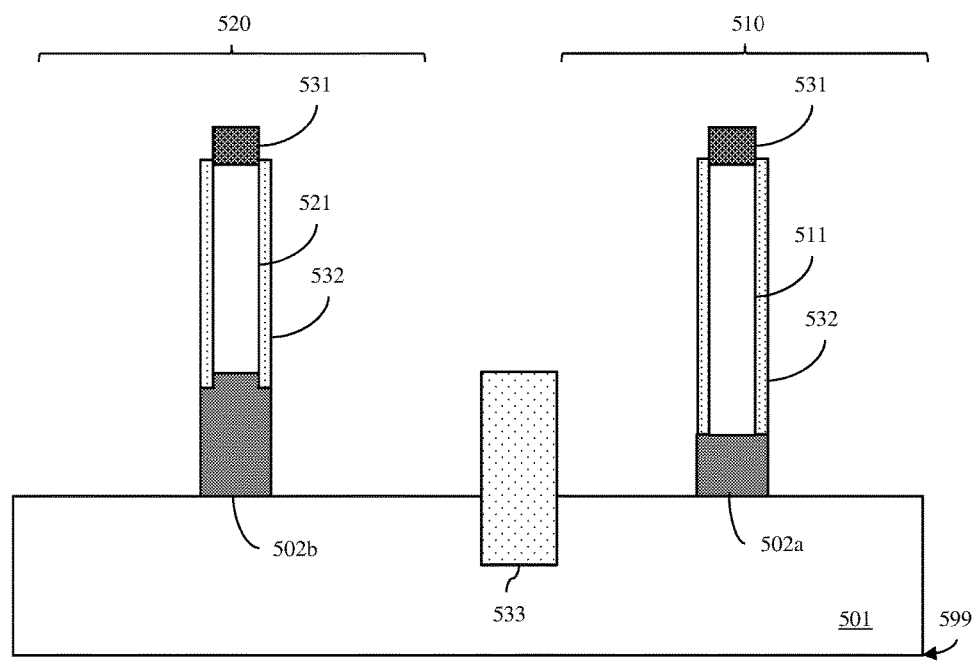
Figure 19A:
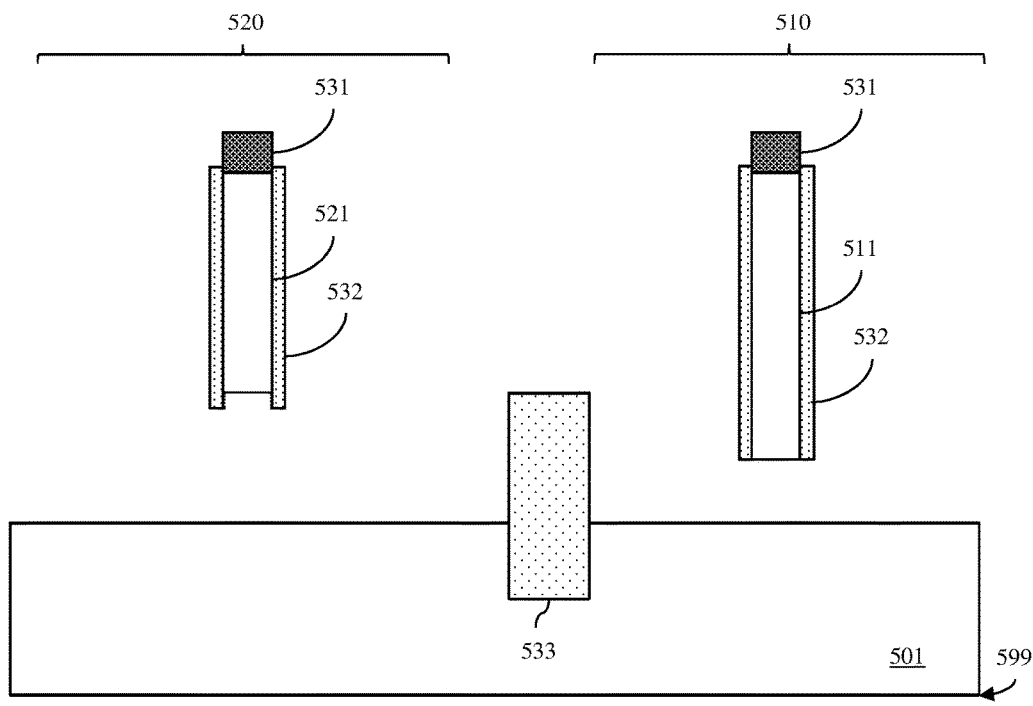
FIGS. 19A and 19B are different cross-section diagrams illustrating a partially completed structure formed according to the flow diagram of FIG. 12.
Figure 19B:
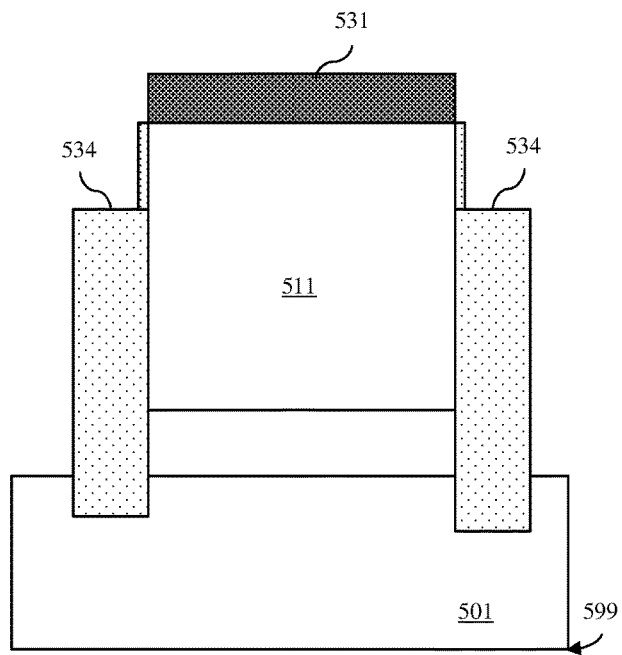

It should be noted that the selective etch process used at process 414 can be an anisotropic etch process such that, as illustrated in FIG. 18, fin-shaped sections of the sacrificial material and, particularly, of the recessed first portion 502a and the unrecessed second portion 502b of the sacrificial layer remain aligned below the first semiconductor fin 511 and the second semiconductor fin 521, respectively. Absent some other supporting structure, the fin-shaped sections shown in FIG. 18 are necessary to support the first semiconductor fin 511 and the second semiconductor fin 521 (i.e., to prevent collapse of the first semiconductor fin 511 and the second semiconductor fin 521). However, optionally, processing can include the formation of support structures (also referred to herein as anchor regions) that are attached to the semiconductor fins, that extend vertically through the sacrificial layer to the substrate and that will support the semiconductor fins during source/drain recess formation. In this case, the selective etch process used to etch the sacrificial layer can be an isotropic etch process that completely removes the first portion 502a of the sacrificial layer from below the first semiconductor fin 511 and completely removes the second portion 502b of the sacrificial layer from below the second semiconductor fin 521 because the anchor regions will provide the necessary support for the first semiconductor fin 511 and the second semiconductor fin 521. Any number of various different techniques could be used to form support structures suitable for supporting the semiconductor fins during source/drain recess formation when the material below the semiconductor fins is removed. For example, anchor regions 534 could be formed at the opposing ends of each of the semiconductor fins (e.g., see the anchor regions 534 at the opposing ends of the first semiconductor fin 511 in FIGS. 19A-19B). In this case, the anchor regions 534 are formed as trenches at the opposing ends of the semiconductor fins, that extend vertically through the sacrificial layer and into the semiconductor substrate and that are filled with isolation material such that the isolation material forms pillars attached to the opposing ends of the semiconductor fins and based in the substrate. Alternatively, any other technique could be used to form anchor regions (i.e., support structures) that are attached to the semiconductor fins, that extend vertically through the sacrificial layer to the substrate and that are suitable for supporting the semiconductor fins when the material below the semiconductor fins is removed. Such techniques are well known in the art and, thus, the details have been omitted from the specification in order to allow the reader to focus on the salient aspects of the disclosed method. As discussed below, these supporting structures (e.g., anchor regions 534) can be selectively removed prior to gate formation.

For purposes of illustration, the remaining process steps of this embodiment of the method are illustrated in the drawings with respect to the partially completed structure shown in FIG. 18. However, it should be understood that, alternatively, these same processes could be performed with respect to the partially completed structure shown in FIG. 19B or any other partially completed structure having anchor regions as discussed above.

Figure 20:
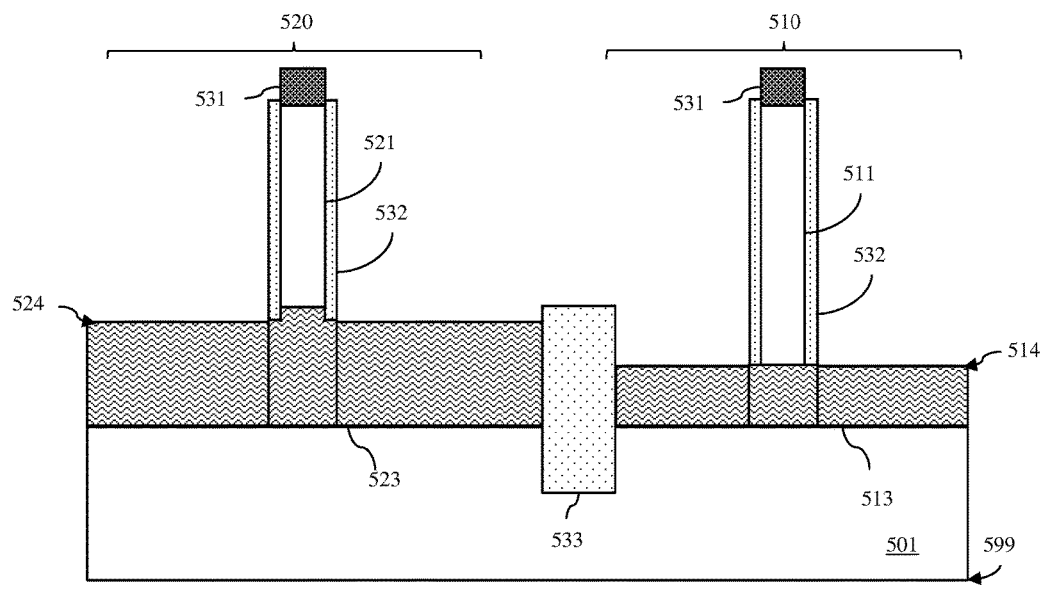
FIG. 20 is a cross-section diagram illustrating a partially completed structure formed according to the flow diagram of FIG. 12.

Next, a first lower source/drain region 513 can be formed on the semiconductor substrate adjacent to the first semiconductor fin 511 and a second lower source/drain region 523 can be formed on the semiconductor substrate 501 adjacent to the second semiconductor fin 521 (see process 416 and FIG. 20). These lower source/drain regions 513, 523 can be formed, for example, by epitaxial deposition of a semiconductor material. This epitaxial deposition process can specifically be a self-limiting process. As a result, the top surface 514 of the first lower source/drain region 513 will be at approximately the same level as the bottom of the sidewall spacer 532 on the first semiconductor fin 511 and the top surface 324 of the second lower source/drain region 523 will be at approximately the same level as the bottom of the sidewall spacer 532 on the second semiconductor fin 521. Thus, the top surface 514 of the first lower source/drain region 513 will be below the level of the top surface 524 of the second lower source/drain region 523. That is, the height of the top surface 514 of the first lower source/drain region 513 as measured from the planar bottom surface 599 of the semiconductor substrate 501 will be less than the height of the top surface 524 of the second lower source/drain region 523 as measured from the planar bottom surface 599 of the semiconductor substrate 501.

It should be noted that this semiconductor material can be in situ doped and can be, for example, silicon or some other semiconductor material suitable for source/drain region formation. In the case were the fin-shaped sections of the portions 502a and 502b of the sacrificial layer remain directly under the semiconductor fins 511 and 521, respectively, a subsequently performed dopant activation anneal can cause dopants from the in-situ doped semiconductor material to diffuse into the fin-shaped sections so to incorporate those fin-shaped sections into the lower source/drain regions. In the case where anchor regions are used to provide support for the first semiconductor fin and the second semiconductor fin, those anchor regions can be selectively removed following formation of the first lower source/drain region and the second lower source/drain region.

Figure 21:
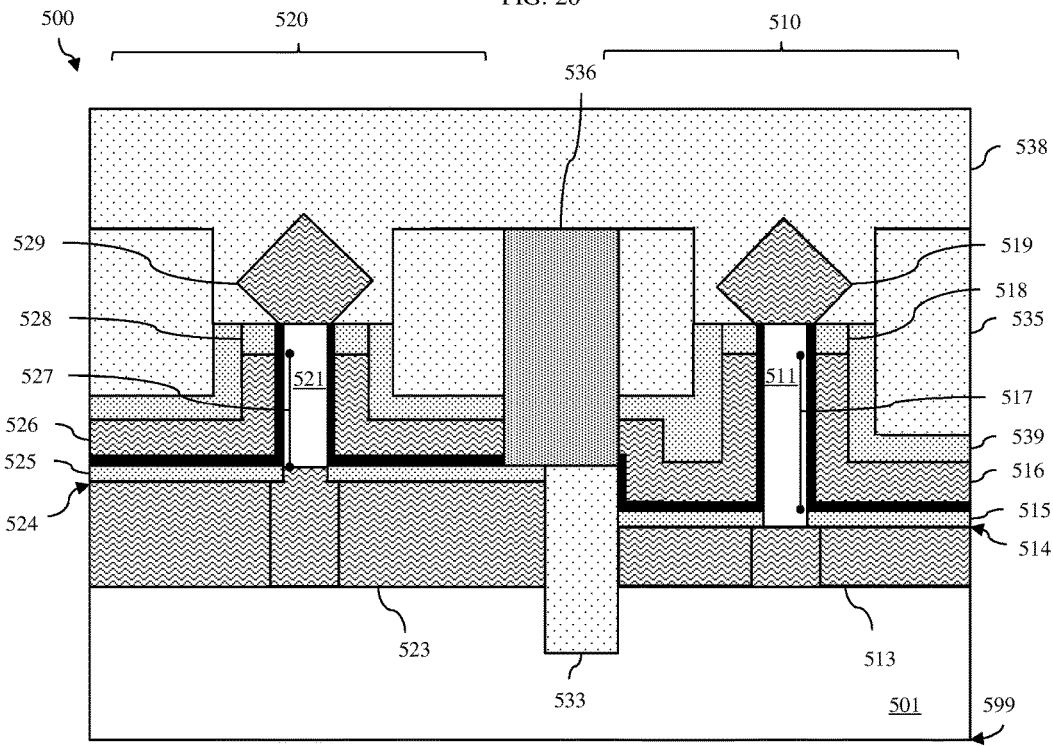
FIG. 21 is a cross-section diagram illustrating a structure formed according to the flow diagram of FIG. 12.

This method embodiment can further include, removing the dielectric sidewall spacers and forming a first vertical field effect transistor (VFET) 510 with the first lower source/drain region 513 and the first semiconductor fin 511 and a second VFET 520 with the second lower source/drain region 523 and the second semiconductor fin 521 (see process 418 and the structure embodiment 500 shown in FIG. 21). Specifically, the first VFET 510 can be formed so that it further includes: a first lower spacer 515 above the first lower source/drain region 513 and positioned laterally adjacent to the first semiconductor fin 511; a first gate 516 above the first lower spacer 515 and positioned laterally adjacent to the first semiconductor fin 511; a first upper spacer 518 above the first gate 516 and positioned laterally adjacent to the first semiconductor fin 511; and a first upper source/drain region 519 above the first upper spacer 518 and immediately adjacent to a first top of the first semiconductor fin 511. Similarly, the second VFET 520 can be formed so that it includes: a second lower spacer 525 above the second lower source/drain region 523 and positioned laterally adjacent to the second semiconductor fin 521; a second gate 526 above the second lower spacer 525, positioned laterally adjacent to the second semiconductor fin 511 and, optionally, electrically isolated from the first gate by an additional isolation region 536; a second upper spacer 528 above the second gate 526 and positioned laterally adjacent to the second semiconductor fin 521; and a second upper source/drain region 529 above the second upper spacer 528 and immediately adjacent to a second top of the second semiconductor fin 521.

The first VFET 510 and the second VFET 520 can specifically be formed at process 418 such that the top surface of the first lower spacer 515 is below the level of the top surface of the second lower spacer 525 (e.g., so that the first lower spacer 515 and the second lower spacer 525 have approximately equal thicknesses) and such the first gate 516 and the second gate 526 have co-planar top surfaces. As a result, the first gate 516 of the first VFET 510 will have a first gate length 517 and the second gate 526 of the second VFET 520 will have a second gate length 527 that is less than the first gate length 517. Due to the longer first gate length, the first VFET 510 will have a higher threshold voltage and, thereby a slower switching speed than the second VFET 520.

Figure 22:
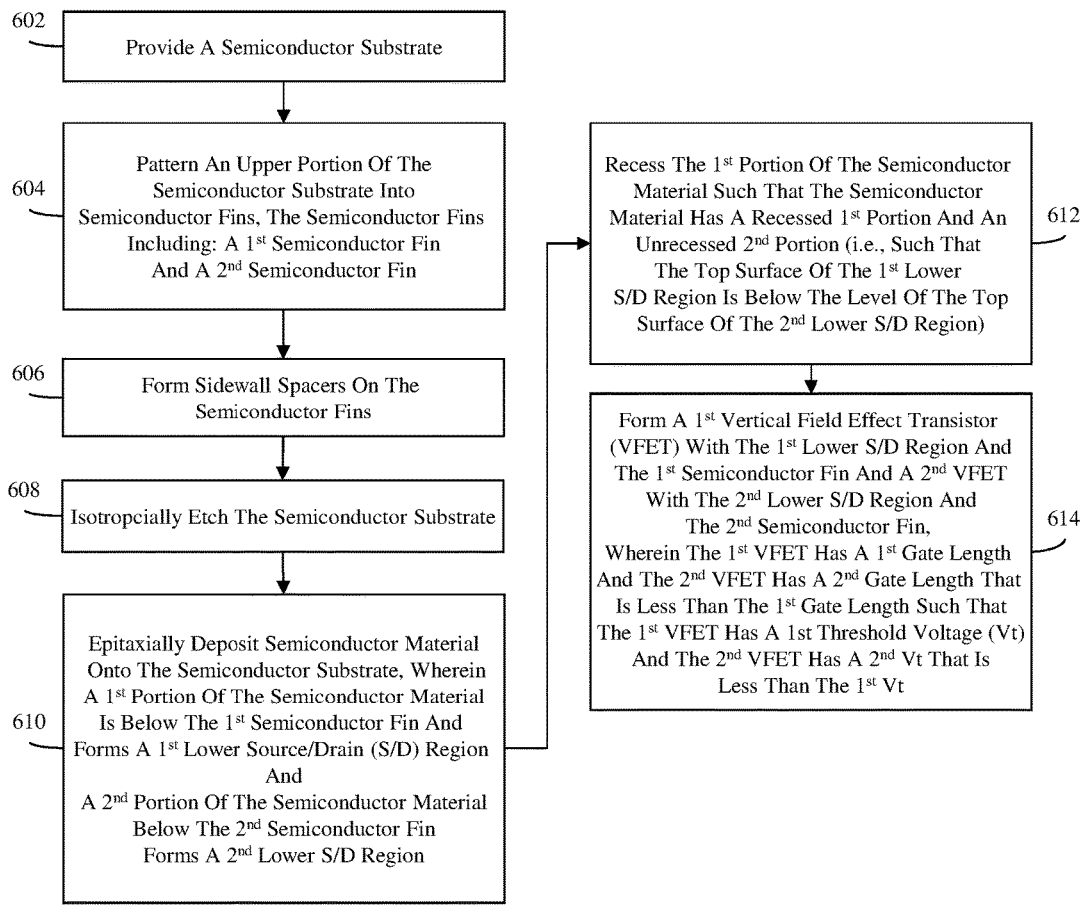
FIG. 22 is a flow diagram illustrating yet another embodiment of the method.
Figure 23:
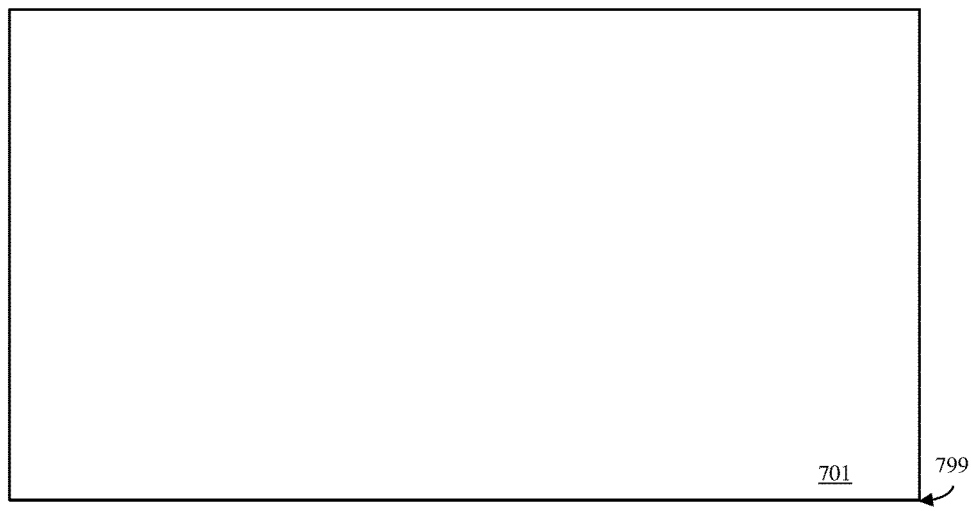
FIGS. 23-28 are cross-section diagrams illustrating partially completed structures formed according to the flow diagram of FIG. 22.

Referring to the flow diagram of FIG. 22, another method embodiment can include providing a semiconductor substrate 701 (see process 602 and FIG. 23). The semiconductor substrate 701 can, for example, be a bulk semiconductor substrate such as a bulk silicon substrate. The semiconductor substrate 701 can have an essentially planar bottom surface 799 and an essentially planar top surface opposite the planar bottom surface.

Figure 24:
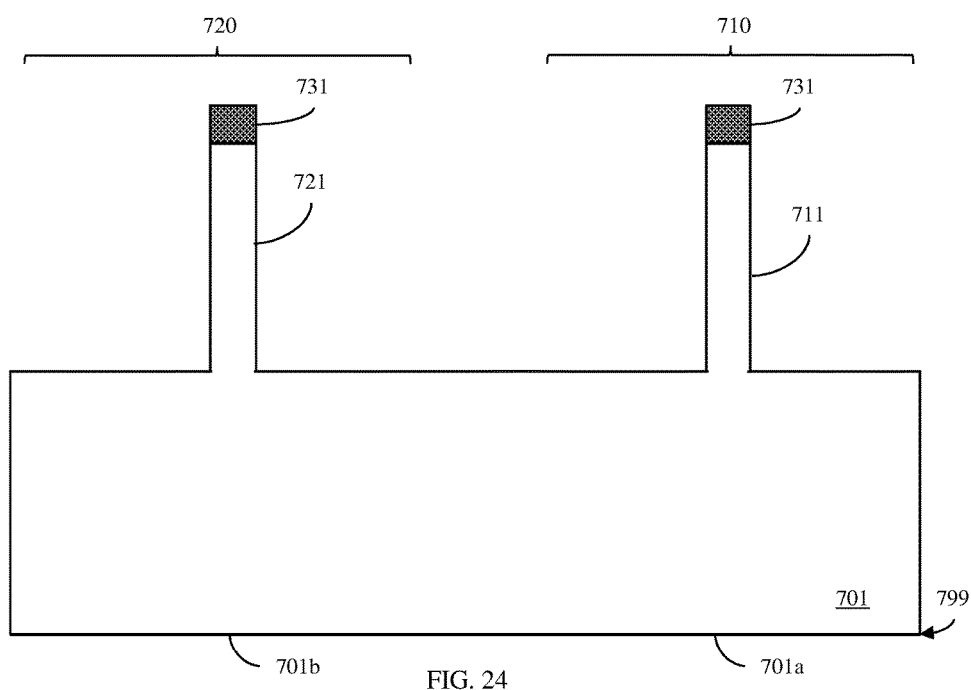

A dielectric hardmask layer can be formed on the semiconductor substrate 701 and the hardmask layer and upper portion of the semiconductor substrate can be patterned into multiple capped semiconductor fins (see process 604 and see FIG. 24). The dielectric hardmask layer can be made of silicon nitride or any other suitable dielectric hardmask material. Techniques for patterning fins (e.g., conventional lithographic patterning techniques, sidewall image transfer patterning techniques, etc.) are well known in the art and, thus, the details have been omitted from the specification in order to allow the reader to focus on the salient aspects of the disclosed embodiments.

For purposes of this disclosure, a fin refers to a tall, relatively thin, essentially rectangular shaped body. However, it should be understood that, depending upon the etch processes used to form the fins, the sidewalls of the fins may not be perfectly vertical (i.e., perpendicular relative to the bottom surface of the semiconductor substrate). That is, the sidewalls may taper slightly from top to bottom or vice versa, they may curve slightly, etc.

In any case, this patterning process 604 can be performed so as to form at least one first semiconductor fin 711, having a dielectric cap 731, in a first area of the semiconductor substrate and at least one second semiconductor fin 721, having a dielectric cap 731, in a second area of the semiconductor substrate. For purposes of illustration, only a single first semiconductor fin 711 and a single second semiconductor fin 721 are shown. However, those skilled in the art will recognize that a VFET may incorporate multiple semiconductor fins. Thus, alternatively, any number of one or more first semiconductor fins and one or more second semiconductor fins could be patterned into the semiconductor layer at process 604 and used to form the first VFET and the second VFET, respectively.

Figure 25:
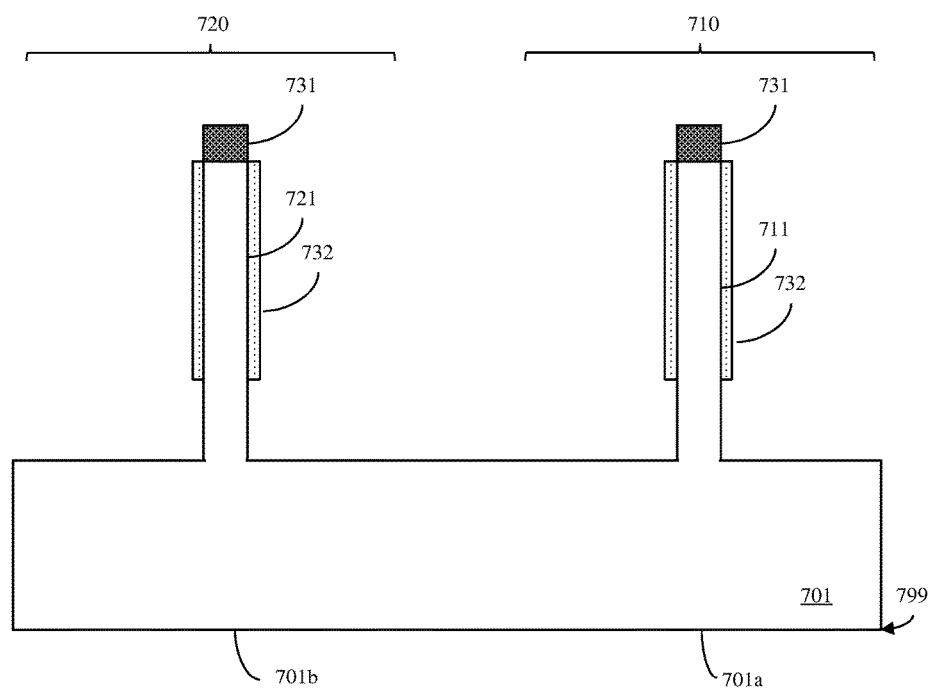

Dielectric sidewall spacers 732 can be formed on the sidewalls of the first semiconductor fin 711 and the second semiconductor fin 721 and the semiconductor substrate 701 can be recessed (see process 606-608 and FIG. 25). Specifically, a dielectric sidewall spacer material can be conformally deposited over the semiconductor fins. The dielectric sidewall spacer material can be, for example, silicon oxycarbide (SiOC), silicon oxycarbonitride (SiOCN), or any other suitable dielectric sidewall spacer material that is different from the dielectric material used for the dielectric caps 731. Then, a selective anisotropic etch process can be performed so as to remove this material from horizontal surfaces, leaving the sidewalls of each semiconductor fin protected by a sidewall spacer 732 and dielectric cap 731. Another etch process can then be used to recess the semiconductor substrate around the first semiconductor fin 711 and the second semiconductor fin 721, effectively extending the lengths of the first semiconductor fin 711 and the second semiconductor fin 721 below the sidewall spacers 732, as illustrated. It should be noted that, preferably, this etch process will be an isotropic etch process that allows the substrate to be etched in all directions in order to undercut the sidewall spacers 732 such that the exposed lower portions of the semiconductor fins and the sidewall-protected upper portions of the semiconductor fins have approximately equal widths. Additionally, depending upon the fin widths, the etch specifications should be selected so that the semiconductor substrate is etched at a faster rate vertically than it is laterally in order to avoid over-etching or cutting through the lower portions of the semiconductor fins below the sidewall spacers and to still allow for a sufficiently deep recess to be formed. Furthermore, the etch specifications should be selected to that vertical etching is stopped at some distance above the planar bottom surface 799 of the semiconductor substrate 701. This etch process can be selective for the semiconductor material of the semiconductor substrate 701 over the dielectric materials of the sidewall spacers 732 and the dielectric caps 731.

Figure 26:
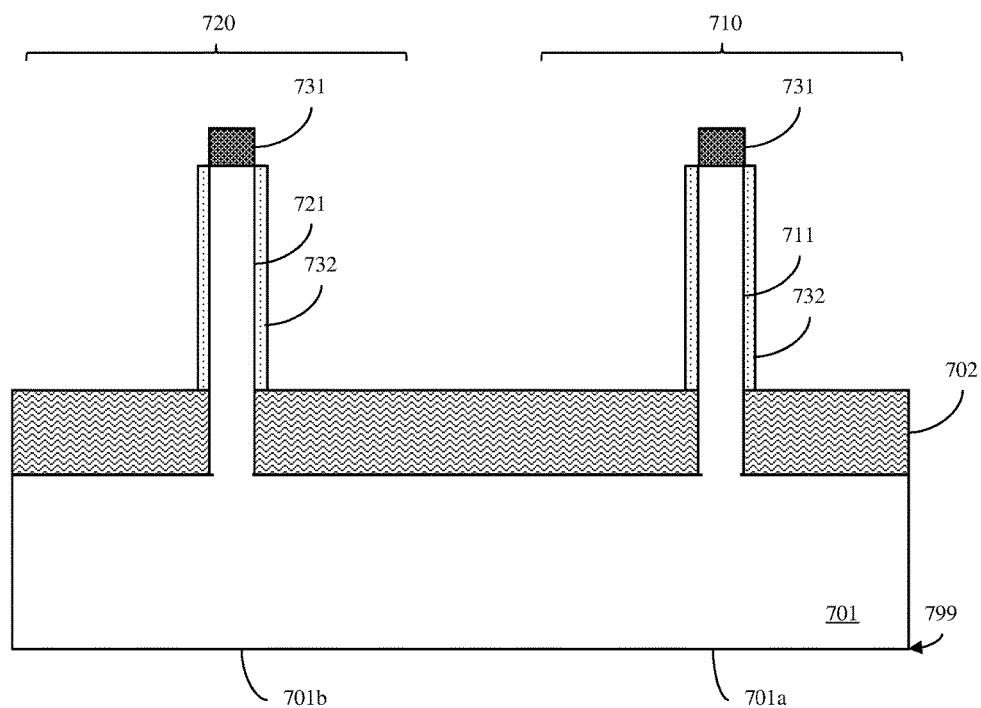

Semiconductor material 702 can then be epitaxially deposited onto the exposed surfaces of the semiconductor substrate 701 and around the exposed lower ends of the semiconductor fins below the level of the sidewall spacers 732 (see process 610 and FIG. 26). Specifically, the semiconductor material will be deposited onto the semiconductor substrate 701 around the exposed lower end of the first semiconductor fin 711 and also around the exposed lower end of the second semiconductor fin 721. The semiconductor material 702 can, for example, be deposited using an epitaxial deposition process that is self-limiting such that the top surface of the semiconductor material 702 is at approximately the level of the bottom of the sidewall spacers 732.

It should be noted that this semiconductor material 702 can be in situ doped and can be, for example, silicon or some other semiconductor material suitable for source/drain region formation. A subsequently performed dopant activation anneal can cause dopants from the in-situ doped semiconductor material to diffuse into the lower ends of the semiconductor fins so to incorporate those lower ends into the lower source/drain regions.

Figure 27:
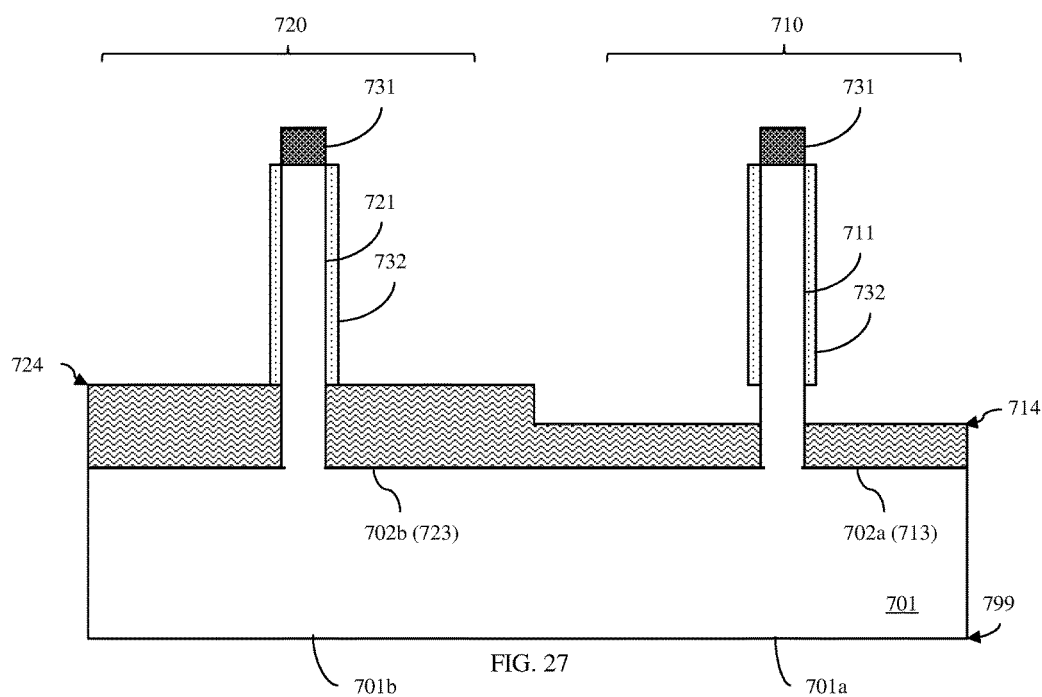

Next, a first portion of the semiconductor material 702 can be recessed relative to a second portion such that the sacrificial material has a recessed first portion 702a, which is adjacent to the first semiconductor fin 711 and functions as a first lower source/drain region 713, and an unrecessed second portion 702b, which is adjacent to the second semiconductor fin 721 and functions as a second lower source/drain region 723 (see process 612 and FIG. 27). For example, a mask can be formed (e.g., lithographically patterned and etched) over the second VFET region (i.e., over the second semiconductor fin 721 and further over the semiconductor material adjacent to that second semiconductor fin 721) such that the first VFET region (i.e., the first semiconductor fin 711 and the semiconductor material adjacent to that first semiconductor fin 711) remains exposed. A selective anisotropic etch process can then be performed so as to recess the exposed semiconductor material. Thus, the top surface 714 of the first lower source/drain region 713 will be below the level of the top surface 724 of the second lower source/drain region 723. That is, the height of the top surface 714 of the first lower source/drain region 713 as measured from the planar bottom surface 799 of the semiconductor substrate 701 will be less than the height of the top surface 724 of the second lower source/drain region 723 as measured from the planar bottom surface 799 of the semiconductor substrate 701. Following process 612, the mask used to protect the second VFET region as well as the sidewall spacers 732 can be selectively removed.

Figure 28:
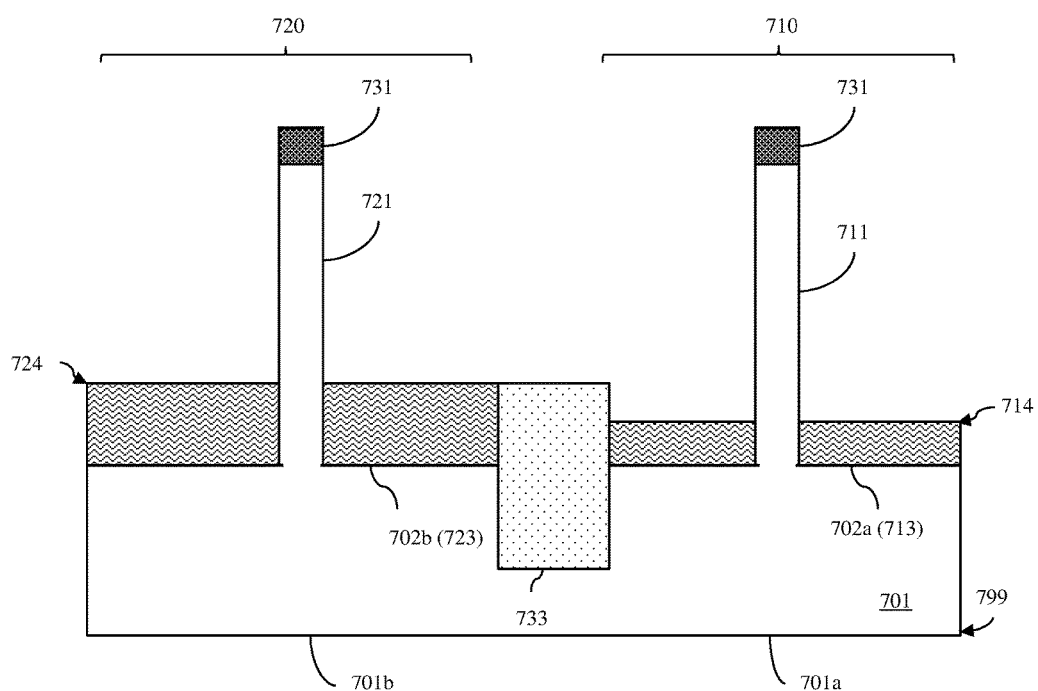

Additionally, a trench isolation region 733 can be formed at the interface between the first lower source/drain region 713 and the second lower source/drain region 723 (see FIG. 28). This trench isolation region 733 can include, for example, a trench, which extends essentially vertically through the semiconductor material 702 and into the semiconductor substrate 701 and which is filled with a dielectric material, such as silicon dioxide or any other suitable dielectric material. Techniques for forming trench isolation regions are well known in the art and, thus, the details have been omitted from this specification in order to allow the reader to focus on the salient aspects of the disclosed embodiments.

This method embodiment can further forming a first vertical field effect transistor (VFET) 710 with the first lower source/drain region 713 and the first semiconductor fin 711 and a second VFET 720 with the second lower source/drain region 723 and the second semiconductor fin 721 (see process 614 and the structure embodiment 700 shown in FIG. 27). Specifically, the first VFET 710 can be formed so that it further includes: a first lower spacer 715 above the first lower source/drain region 713 and positioned laterally adjacent to the first semiconductor fin 711; a first gate 716 above the first lower spacer 715 and positioned laterally adjacent to the first semiconductor fin 711; a first upper spacer 718 above the first gate 516 and positioned laterally adjacent to the first semiconductor fin 711; and a first upper source/drain region 719 above the first upper spacer 718 and immediately adjacent to a first top of the first semiconductor fin 711. Similarly, the second VFET 720 can be formed so that it includes: a second lower spacer 725 above the second lower source/drain region 723 and positioned laterally adjacent to the second semiconductor fin 721; a second gate 726 above the second lower spacer 725, positioned laterally adjacent to the second semiconductor fin 711 and, optionally, electrically isolated from the first gate by an additional isolation region 736; a second upper spacer 728 above the second gate 726 and positioned laterally adjacent to the second semiconductor fin 721; and a second upper source/drain region 729 above the second upper spacer 728 and immediately adjacent to a second top of the second semiconductor fin 721.

The first VFET 710 and the second VFET 720 can specifically be formed such that the top surface of the first lower spacer 715 is below the level of the top surface of the second lower spacer 725 (e.g., such that the first lower spacer 715 and the second lower spacer 725 have equal thicknesses) and such the first gate 716 and the second gate 726 have co-planar top surfaces. As a result, the first gate 716 of the first VFET 710 will have a first gate length 717 and the second gate 726 of the second VFET 720 will have a second gate length 727 that is less than the first gate length 717. Due to the longer first gate length, the first VFET 710 will have a higher threshold voltage and, thereby a slower switching speed than the second VFET 720.

Figure 29:
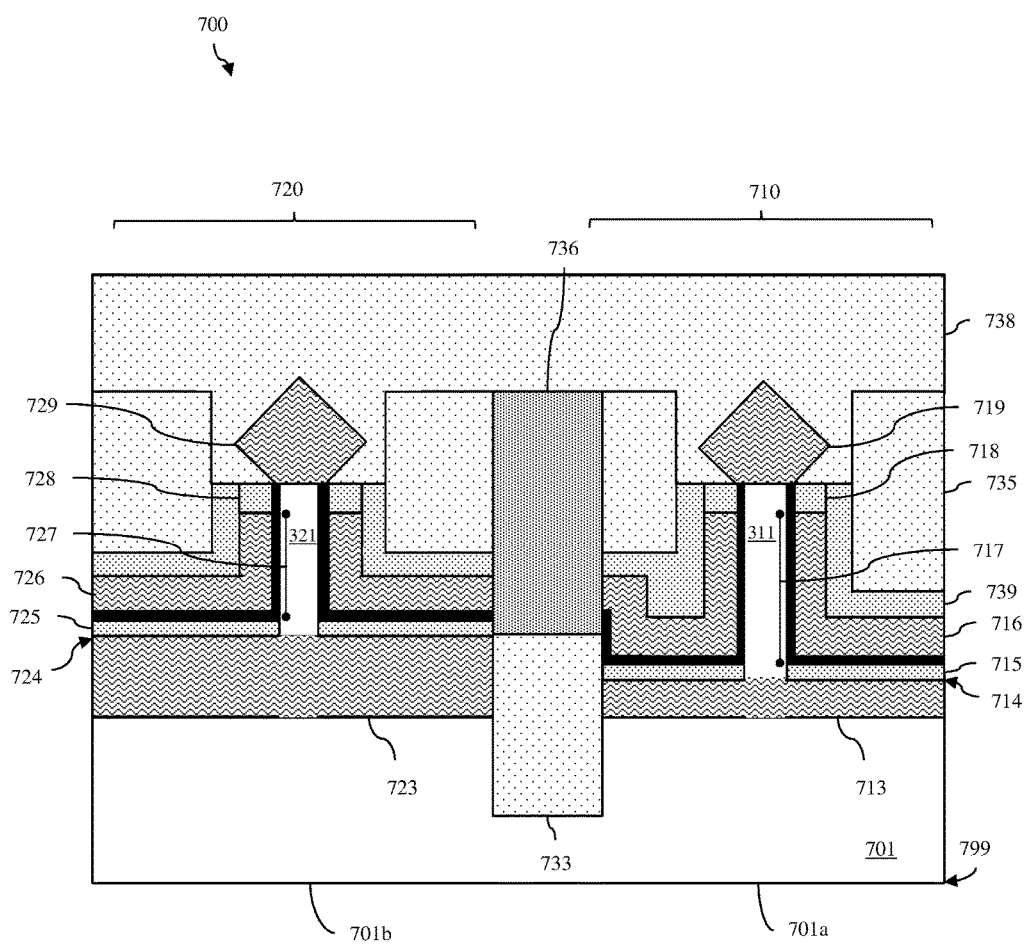
FIG. 29 is a cross-section diagram illustrating a structure formed according to the flow diagram of FIG. 22.

As mentioned above, in order to complete the disclosed integrated circuit (IC) structure embodiments 300 of FIG. 11, 500 of FIG. 21 and 700 of FIG. 29, at process 218 of the flow diagram of FIG. 2, at process 418 of the flow diagram of FIG. 11 and at process 614 of the flow diagram of FIG. 22, respectively, the first lower source/drain region 313, 513, 713 and the first semiconductor fin 311, 511 and 711 are used to form the first VFET 310, 510, 710 and the second lower source/drain region 323, 523, 723 and the second semiconductor fin 321, 521, 721 are used to form the second VFET 320, 520, 720.

Exemplary process steps that could be used to complete the IC structure embodiments are as follows.

A lower spacer layer can be deposited and etched back so as to have a given thickness above the second lower source/drain region 323, 523, 723. A mask can be formed so as to cover the portion of the lower spacer layer above the second lower source/drain region 323, 523, 723 and the portion of the lower spacer above the first lower source/drain region 313, 513, 713 can be further etched back to a given thickness, thereby forming the first lower spacer 315, 515, 715 on the first lower source/drain region 313, 513, 713 and the second lower spacer 325, 525, 725 on the second lower source/drain region 323, 523, 723, wherein the top surface of the first lower spacer 315, 515, 715 is below the level of the top surface of the second lower spacer 325, 525, 725. This lower spacer layer can be, for example, a layer of a low-K dielectric material. Those skilled in the art will recognize that a low-K dielectric material is a dielectric material having a dielectric constant that is lower than the dielectric constant of silicon dioxide and, particularly, that is lower than 3.9. One exemplary low-K dielectric material that could be used for the lower spacer layer is carbon-doped silicon oxide (SiOCH). Alternatively, the lower spacer layer can be a layer of any other suitable dielectric material.

After the first lower spacer 315, 515, 715 and the second lower spacer 325, 525, 725 are formed, any of various different conventional VFET processing techniques could be used to complete the VFETs.

For example, multiple conformal layers can be deposited over the partially completed structure. These layers can include, for example, a gate dielectric layer, at least one gate conductor layer (e.g., a work function metal layer) on the gate dielectric layer, and an additional conformal dielectric layer 339, 539, 739 (e.g., which is made of the same material as the lower spacer layer) on the gate conductor layer. A blanket layer 335, 535, 735 of interlayer dielectric (ILD) material can be deposited on the additional conformal dielectric layer 339, 539, 739. The ILD material can be made of silicon dioxide, borophosphosilicate glass (BPSG), tetraethyl orthosilicate (TEOS), fluorinated tetraethyl orthosilicate (FTEOS), etc. Then, a polishing process (e.g., a chemical mechanical polishing (CMP) process) can be performed in order to expose the dielectric caps 331, 531, 731 on the tops of the first semiconductor fin 311, 511, 711 and the second semiconductor fin 321, 521, 721 and also to expose the tops of vertical portions of the gate conductor layer that are positioned laterally adjacent to the sidewalls of the first semiconductor fin 311, 511, 711 and the second semiconductor fin 321, 521, 721.

Optionally, an additional isolation region 336, 536, 736 (i.e., a gate cut isolation region) can be formed above the isolation region 333, 533, 733. For example, a trench can be formed such that it extends essentially vertically between the devices through the layer 335, 535, 735 of ILD material, through the additional conformal dielectric layer 339, 539, 739 and further the gate conductor layer (e.g., down to the isolation region 333, 533, 733). Isolation material (e.g., silicon dioxide or any other suitable isolation material) can then be deposited so as to fill the trench, thereby forming the additional isolation region 336, 536, 736. This additional isolation region 336, 536, 736 will electrically isolate the first gate 316, 516, 716 from the second gate 326, 526, 726 in the completed IC structure 300, 500, 700. A polishing process (e.g., a CMP process) can then be performed in order to again expose the tops of the dielectric caps and the vertical portions of the gate conductor layer.

The vertical portions of the gate conductor layer adjacent to the sidewalls of the first semiconductor fin 311, 511, 711 and the second semiconductor fin 321, 521, 721 can be essentially simultaneously recessed to the same depth such that the top surfaces of those vertical portions and, thereby such that the top surfaces of the resulting gate structures (i.e., the first gate 316, 516, 716 of the first VFET 310, 510, 710 and the second gate 326, 526, 726 of the second VFET 320, 520, 720) are essentially co-planar. However, as discussed above, since top surface of the first lower spacer 315, 515, 715, upon which the first gate 316, 516, 716 is formed, is below the level of the top surface of the second lower spacer 325, 535, 725, upon which the second gate 326, 526, 726 is formed, the first gate 316, 516, 716 of the first VFET 310, 510, 710 has a first gate length 317, 517, 717 and the second gate 326, 526, 726 of the second VFET 320, 520, 720 has a second gate length 327, 527, 727 that is less than the first gate length 317, 517, 717. Due to the longer first gate length, the first VFET 310, 510, 710 has a higher threshold voltage and, thereby a slower switching speed than the second VFET 320, 520, 720.

Once the gate lengths are established, a second spacer layer can be deposited so as to fill the spaces created by recessing the gate conductor layer such that the second spacer layer is above and immediately adjacent to the first gate 316, 516, 716 and the second gate 326, 526, 726 and further laterally surrounds and is immediately adjacent to upper ends of the semiconductor fins. This second spacer layer can, for example, be made of the same dielectric material as that used for the first spacer layer and/or for the additional conformal dielectric layer 339, 539, 739. Another polishing process (e.g., another CMP process) can be performed to again expose the dielectric caps 331, 531, 731. Then, at least one additional selective etch process can be performed in order to remove the dielectric caps 331, 531, 731 and recess portions of the additional conformal dielectric layer 339, 539, 739 and the second spacer layer adjacent to the first semiconductor fin 311, 511, 711 and the second semiconductor fin 321, 521, 721, thereby forming the first upper spacer 318, 518, 718 on the first gate 316, 516, 716 and the second upper spacer 328, 528, 728 on the second gate 326, 526, 726 and creating source/drain openings within the layer 335, 535, 735 of ILD material. The tops of the first semiconductor fin 311, 511, 711 and the second semiconductor fin 321, 521, 721 will be exposed within these openings.

Semiconductor material can then be epitaxially deposited into the source/drain openings on the tops of the first semiconductor fin 311, 511, 711 and the second semiconductor fin 321, 521, 721, thereby forming the first upper source/drain region 319, 519, 719 on the first upper spacer 318, 518, 718 and immediately adjacent to the top of the first semiconductor fin 311, 511, 711 and the second upper source/drain region 329, 529, 729 on the second upper spacer 328, 528, 728 and immediately adjacent to the top of the second semiconductor fin 321, 521, 721.

Another layer 338, 538, 738 of ILD material can subsequently be deposited onto the top surface of the layer 335, 535, 735, thereby filling any remaining space in the source/drain openings. This layer 338, 538 238 can be made of the same ILD material(s) or different ILD material(s) than the layer 335, 535, 735.

Additional processing can include, but is not limited to, contact formation and back end of the line (BEOL) metal level formation.

The above-described exemplary processing steps, which could be performed after the first lower spacer 315, 515, 715 and the second lower spacer 325, 525, 725 are formed and which are result in the exemplary IC structure embodiments 300, 500, 700 shown in FIGS. 11, 21 and 29, are not intended to be limiting. As mentioned above, after the first lower spacer 315, 515, 715 and the second lower spacer 325, 525, 725 are formed such that the top surface of the first lower spacer 315, 515, 715 is below the level of the top surface of the second lower spacer 325, 525, 725, any of various different conventional VFET processing techniques could be used to complete the VFETs.

For example, alternatively, VFET processing techniques that results in self-aligned gates could be performed. Specifically, a thin conformal dielectric layer could be deposited over the partially completed structure. A blanket dummy gate layer could be deposited on the thin conformal dielectric layer, polished and recessed so as to set the heights of gates that will subsequently replace the dummy gate layer. An upper spacer layer could be formed on the dummy gate layer and recessed. Upper source/drain regions could be formed above the upper spacer layer adjacent to the tops of the semiconductor fins. Dielectric caps could be formed on the tops of the upper source/drain regions and dielectric sidewall spacers could be formed so as to laterally surround the upper source/drain regions. Using the combination of the dielectric cap and dielectric sidewall spacer on each of the semiconductor fins as a mask section, selective anisotropic etch processes could be performed in order to pattern the upper spacer layer into a first upper spacer and a second upper spacer and to further pattern the dummy gate layer into a first dummy gate adjacent to the first semiconductor fin between the first lower spacer and the first upper spacer and a second dummy gate adjacent to the second semiconductor fin between the second lower spacer layer and the second upper spacer layer. The first dummy gate and the second dummy gate could be selectively removed and replaced with self-aligned gates (i.e., a first gate and a second gate, respectively). In this case, the first dummy gate between first lower spacer and the first upper spacer will be taller than the second dummy gate between the second lower spacer and the second upper spacer and, thus, the first gate length of the first gate, which replaces the first dummy gate, will be greater than the second gate length of the second gate, which replaces the second dummy gate.

Referring to FIGS. 11, 21 and 29, also disclosed herein are embodiments 300, 500, 700 of an integrated circuit (IC) structure with multiple vertical field effect transistors (VFETs) having different gate lengths and, thereby different threshold voltages (Vts) and different switching speeds.

Specifically, each embodiment 300, 500, 700 of the IC structure includes a semiconductor substrate 301, 501, 701. The semiconductor substrate 301, 501, 701 can, for example, be a bulk semiconductor substrate such as a bulk silicon substrate having an essentially planar bottom surface 399, 599, 799.

Each embodiment 300, 500, 700 of the IC structure further includes at least two VFETs (i.e., a first VFET 310, 510, 710 and a second VFET 320, 520, 720) on a top surface of the semiconductor substrate 301, 501, 701 opposite the planar bottom surface.

The first VFET 310, 510, 710 can include a first lower source/drain region 313, 513, 713, which is immediately adjacent to the semiconductor substrate 301, 501, 701. A first semiconductor fin 311, 511, 711 can be immediately adjacent to the first lower source/drain region 313, 513, 713 and can extend essentially vertically upward from the top surface of the first lower source/drain region 313, 513, 713. The first VFET 310, 510, 710 can also include a first lower spacer 315, 515, 715. This first lower spacer 315, 515, 715 can be positioned above and immediately adjacent to the first lower source/drain region 313, 513, 713 and positioned laterally immediately adjacent to the first semiconductor fin 311, 511, 711 (e.g., can laterally surround the first semiconductor fin). The first VFET 310, 510, 710 can further include a first gate 316, 516, 716. The first gate 316, 516, 716 can be positioned above and immediately adjacent to the first lower spacer 315, 515, 715 and positioned laterally immediately adjacent to the first semiconductor fin 311, 511, 711 (e.g., can laterally surround the first semiconductor fin). The first VFET 310, 510, 710 can further include a first upper spacer 318, 518, 718. The first upper spacer 318, 518, 718 can be positioned above and immediately adjacent to the first gate 316, 516, 716 and positioned laterally immediately adjacent to the first semiconductor fin 311, 511, 711 (e.g., can laterally surround the first semiconductor fin). The first VFET 310, 510, 710 can further include a first upper source/drain region 319, 519, 719. The first upper source/drain region 319, 519, 719 can be positioned above and immediately adjacent to the first upper spacer 318, 518, 718 and can further be positioned immediately adjacent to a top of the first semiconductor fin 311, 511, 711.

The second VFET 320, 520, 720 can include a second lower source/drain region 323, 523, 723, which is immediately adjacent to the semiconductor substrate 301, 501, 701. A second semiconductor fin 321, 521, 721 can be immediately adjacent to the second lower source/drain region 323, 523, 723 and can extend essentially vertically upward from the top surface of the second lower source/drain region 323, 523, 723. The second VFET 320, 520, 720 can also include a second lower spacer 325, 525, 725. This second lower spacer 325, 525, 725 can be above and immediately adjacent to the second lower source/drain region 323, 523, 723 and positioned laterally immediately adjacent to second semiconductor fin 321, 521, 721 (e.g., can laterally surround the second semiconductor fin). The second VFET 320, 520, 720 can further include a second gate 326, 526, 726. The second gate 326, 526, 726 can be positioned above and immediately adjacent to the second lower spacer 325, 525, 725 and positioned laterally immediately adjacent to the second semiconductor fin 321, 521, 721 (e.g., can laterally surround the second semiconductor fin). The second VFET 320, 520, 720 can further include a second upper spacer 328, 528, 728. The second upper spacer 328, 528, 728 can be positioned above and immediately adjacent to the second gate 326, 526, 726 and positioned laterally immediately adjacent the second semiconductor fin 321, 521, 721 (e.g., can laterally surround the second semiconductor fin). The second VFET 320, 520, 720 can further include a second upper source/drain region 329, 529, 729. The second upper source/drain region 329, 529, 729 can be positioned above and immediately adjacent to the second upper spacer 328, 528, 728 and positioned immediately adjacent to a top of the second semiconductor fin 321, 521, 721.

In each of the embodiments 300, 500, 700 of the IC structure, the distance between the planar bottom surface 399, 599, 799 of the semiconductor substrate 301, 501, 701 and the top surface 314, 514, 714 of the first lower source/drain region 313, 515, 713 is less than the distance between the planar bottom surface 399, 599, 799 of the semiconductor substrate 301, 501, 701 and the top surface 324, 524, 724 of the second lower source/drain region 323, 523, 723 Thus, the top surface 314, 514, 714 of the first lower source/drain region 313, 513, 713 is below the level of the top surface 324, 524, 724 of the second lower source/drain region 323, 523, 723. Additionally, the lower spacers have essentially the same thicknesses and, thus, the top surface of the first lower spacer 315, 515, 715 is below the level of the top surface of the second lower spacer 325, 525, 725. It should be noted that in the embodiment 300 of the IC structure, the top surface of the semiconductor substrate is tiered so that the bottom surface of the first lower source/drain region 313 is below the level of the bottom surface of the second lower source/drain region 323 and the first lower source/drain region 313 and the second lower source/drain region 323 have approximately equal thicknesses, as illustrated in FIG. 11. However, in the embodiments 500 and 700, the top surface of the semiconductor substrate is essentially planar so that the bottom surface of the first lower source/drain region 513, 713 and the bottom surface of the second lower source/drain region 523, 723 are at essentially the same level. In this case, the first lower source/drain region 513, 713 is relatively thin as compared to the second lower source/drain region 523, 723.

In each of the embodiments 300, 500, 700 of the IC structure, the first gate 316, 516, 716 and the second gate 326, 526, 726 have co-planar top surfaces. Since the second gate 326, 526, 726 sits on the second lower spacer 325, 525, 725, which is at a higher level than the first lower spacer 315, 515, 715, the first gate 316, 516, 716 of the first VFET 310, 510, 710 has a first gate length 317, 517, 717 and the second gate 326, 526, 726 of the second VFET 320, 520, 720 has a second gate length 327, 527, 727 that is less than the first gate length 317, 517, 717. Due to the longer first gate length, the first VFET 310, 510, 710 has a higher threshold voltage and, thereby a slower switching speed than the second VFET 320, 520, 720.

It should be noted that in the method and structure embodiments described above, the first VFET 310, 510, 710 and the second VFET 320, 520, 720 could by the same type VFETs. conductivity. Specifically, the first VFET 310, 510, 710 and the second VFET 320, 520, 720 can both be N-type VFETs or P-type VFETs. Alternatively, the first VFET 310, 510, 710 and the second VFET 320, 520, 720 could be different type VFETs. That is, one could be an N-type VFET and the other could be a P-type. In this case, it should be understood that the method embodiments would further incorporate discrete masked processes, as necessary. For example, discrete masked processes would be used when epitaxially depositing semiconductor material for the first lower source/drain region 313, 513, 713 and for the second lower source/drain region 323, 523, 723 so that these regions have different type conductivities. Similarly, discrete masked processes would be used when epitaxially depositing semiconductor material for the first upper source/drain region 319, 519, 719 and the second upper source/drain region 329, 529, 729 so that these regions have different type conductivities. Additionally, discrete masked processes could be used when forming the first gate 316, 516, 716 and the second gate 326, 526, 726 so that these gates have different work functions (include different work function metals).

Those skilled in the art will recognize that, for an N-type VFET, the lower source/drain region and the upper source/drain region can each be doped so as to have N-type conductivity at a relatively high conductivity level. The channel region, which is defined within the semiconductor fin, can be either undoped or can be doped so as to have P-type conductivity at a relatively high conductivity level. The gate can include a conformal gate dielectric layer and a gate conductor layer. The conformal gate dielectric layer can be a high-K dielectric material or, more particularly, a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The gate conductor layer can include a work function metal layer. The work function metal layer can be a layer of a metal material or a metal alloy material that is preselected in order to achieve the optimal gate conductor work function for an N-type VFET. Specifically, the optimal gate conductor work function of an N-type VFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. Optionally, the gate conductor layer may further include conductive fill material on the work function metal layer. The conductive fill material can be any suitable metal or metal alloy fill material including, but not limited to, tungsten, a tungsten alloy (e.g., tungsten silicide or titanium tungsten), cobalt, or aluminum.

For a P-type VFET, the lower source/drain region and the upper source/drain region can each be doped so as to have P-type conductivity at a relatively high conductivity level. The channel region, which is defined within the semiconductor fin, can be either undoped or can be doped so as to have N-type conductivity at a relatively high conductivity level. The gate can include a conformal gate dielectric layer and a gate conductor layer. The conformal gate dielectric layer can be a high-K dielectric material or, more particularly, a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The gate conductor layer can include a work function metal layer. The work function metal layer can be a layer of a metal material or a metal alloy material that is preselected in order to achieve the optimal gate conductor work function for a P-type VFET. Specifically, the optimal gate conductor work function for a P-type FET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Optionally, the gate conductor layer can further include conductive fill material on the work function metal layer. The conductive fill material can be any suitable metal or metal alloy fill material including, but not limited to, tungsten, a tungsten alloy (e.g., tungsten silicide or titanium tungsten), cobalt, or aluminum.

Those skilled in the art will further recognize that dopants can be used to achieve different type conductivities in the semiconductor materials discussed above and these dopants may vary depending upon the type of semiconductor material. For example, a silicon-based semiconductor material having N-type conductivity is typically doped with a Group V dopant, such as arsenic (As), phosphorous (P) or antimony (Sb), whereas a silicon-based semiconductor material having P-type conductivity is typically doped with a Group III dopant, such as boron (B) or indium (In). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming, on a semiconductor substrate, a first lower source/drain region with a first semiconductor fin extending vertically upward from a top surface of the first lower source/drain region and a second lower source/drain region with a second semiconductor fin extending upward from a top surface of the second lower source/drain region,
        wherein a height of the top surface of the first lower source/drain region as measured from a planar bottom surface of the semiconductor substrate is less than a height of the top surface of the second lower source/drain region as measured from the planar bottom surface of the semiconductor substrate such that the top surface of the first lower source/drain region is below a level of the top surface of the second lower source/drain region, and
        wherein the first semiconductor fin and the second semiconductor fin are patterned from a monocrystalline epitaxial semiconductor layer and are physically separated from the semiconductor substrate by the first lower source/drain region and the second lower source/drain region, respectively; and,
    forming a first transistor with the first lower source/drain region and a second transistor with the second lower source/drain region.

2. The method of claim 1,
    wherein the forming of the first transistor and the second transistor further comprises:
        forming a first lower spacer above the first lower source/drain region and positioned laterally adjacent to the first semiconductor fin and a second lower spacer above the second lower source/drain region and positioned laterally adjacent to the second semiconductor fin;
        forming a first gate above the first lower spacer and positioned laterally adjacent to the first semiconductor fin and a second gate above the second lower spacer and positioned laterally adjacent to the second semiconductor fin;
        forming a first upper spacer above the first gate and positioned laterally adjacent to the first semiconductor fin and a second upper spacer above the second gate and positioned laterally adjacent to the second semiconductor fin; and
        forming a first upper source/drain region above the first upper spacer and immediately adjacent to a top of the first semiconductor fin and a second upper source/drain region above the second upper spacer and immediately adjacent to a top of the second semiconductor fin,
    wherein a top surface of the first lower spacer is below a level of a top surface of the second lower spacer and the first gate and the second gate have co-planar top surfaces such that the first gate has a first gate length and the second gate has a second gate length that is less than the first gate length and such that the first transistor has a first threshold voltage and the second transistor has a second threshold voltage that is less than the first threshold voltage.

3. The method of claim 2, further comprising, before the forming of the first lower source/drain region and the second lower source/drain region:
    providing the semiconductor substrate;
    recessing a first portion of the semiconductor substrate such that the semiconductor substrate has a recessed first portion and an unrecessed second portion;

conformally depositing a sacrificial layer on the semiconductor substrate;
depositing the monocrystalline epitaxial semiconductor layer on the sacrificial layer;
planarizing the monocrystalline epitaxial semiconductor layer;
patterning the monocrystalline epitaxial semiconductor layer into the first semiconductor fin and the second semiconductor fin, the first semiconductor fin being above the recessed first portion of the semiconductor substrate and the second semiconductor fin being above the unrecessed second portion of the semiconductor substrate such that the first semiconductor fin is taller than the second semiconductor fin; and
etching the sacrificial layer to expose a top surface of the recessed first portion of the semiconductor substrate and a top surface of the unrecessed second portion of the semiconductor substrate,
wherein the forming of the first lower source/drain region and the second lower source/drain region comprises epitaxially depositing semiconductor material on the top surface of the recessed first portion of the semiconductor substrate adjacent to the first semiconductor fin to form the first lower source/drain region and on the top surface of the unrecessed second portion of the semiconductor substrate adjacent to the second semiconductor fin to form the second lower source/drain region.

4. The method of claim 2, further comprising, before the forming of the first lower source/drain region and the second lower source/drain region:
providing the semiconductor substrate;
depositing a sacrificial layer on the semiconductor substrate;
recessing a first portion of the sacrificial layer such that the sacrificial layer has a recessed first portion and an unrecessed second portion;
depositing the monocrystalline epitaxial semiconductor layer on the sacrificial layer;
planarizing the monocrystalline epitaxial semiconductor layer;
patterning the monocrystalline epitaxial semiconductor layer into the first semiconductor fin and the second semiconductor fin, the first semiconductor fin being above the recessed first portion of the sacrificial layer and the second semiconductor fin being above the unrecessed second portion of the sacrificial layer such that the first semiconductor fin is taller than the second semiconductor fin; and
etching the recessed first portion and the unrecessed second portion of the sacrificial layer to expose the semiconductor substrate,
wherein the forming of the first lower source/drain region and the second lower source/drain region comprises epitaxially depositing semiconductor material on the semiconductor substrate adjacent to the first semiconductor fin to form the first lower source/drain region and on the semiconductor substrate adjacent to the second semiconductor fin to form the second lower source/drain region.

5. The method of claim 1, further comprising forming a trench isolation region between the first lower source/drain region and the second lower source/drain region.

6. A method comprising:
forming a sacrificial layer on a semiconductor substrate such that the sacrificial layer has a first portion and a second portion, wherein a height of a top surface of the first portion of the sacrificial layer as measured from a planar bottom surface of the semiconductor substrate is less than a height of a top surface of the second portion of the sacrificial layer as measured from the planar bottom surface of the semiconductor substrate such that the top surface of the first portion of the sacrificial layer is below a level of the top surface of the second portion of the sacrificial layer;
forming a semiconductor layer on the sacrificial layer;
planarizing the semiconductor layer;
patterning the semiconductor layer into a first semiconductor fin and a second semiconductor fin, the first semiconductor fin being above the first portion of the sacrificial layer and the second semiconductor fin being above the second portion of the sacrificial layer such that the first semiconductor fin is taller than the second semiconductor fin;
etching the sacrificial layer to expose the semiconductor substrate;
forming a first lower source/drain region on the semiconductor substrate adjacent to the first semiconductor fin and a second lower source/drain region on the semiconductor substrate adjacent to the second semiconductor fin such that a top surface of the first lower source/drain region is below a level of a top surface of the second lower source/drain region; and
forming a first transistor with the first lower source/drain region and the first semiconductor fin and a second transistor with the second lower source/drain region and the second semiconductor fin.

7. The method of claim 6, the semiconductor substrate and the semiconductor layer comprising silicon and the sacrificial layer comprising any of silicon germanium, silicon germanium carbide and boron-doped silicon germanium.

8. The method of claim 6, wherein the forming of the first transistor and the second transistor comprises:
forming a first lower spacer above the first lower source/drain region and positioned laterally adjacent to the first semiconductor fin and a second lower spacer above the second lower source/drain region and positioned laterally adjacent to the second semiconductor fin;
forming a first gate above the first lower spacer and positioned laterally adjacent to the first semiconductor fin and a second gate above the second lower source/drain region and positioned laterally adjacent to the second semiconductor fin;
forming a first upper spacer above the first gate and positioned laterally adjacent to the first semiconductor fin and a second upper spacer above the second gate and positioned laterally adjacent to the second semiconductor fin; and
forming a first upper source/drain region above the first upper spacer and immediately adjacent to a top of the first semiconductor fin and a second upper source/drain region above the second upper spacer and immediately adjacent to a top of the second semiconductor fin,
wherein a top surface of the first lower spacer is below a level of a top surface of the second lower spacer and the first gate and the second gate have co-planar top surfaces such that the first gate has a first gate length and the second gate has a second gate length that is less than the first gate length and such that the first transistor has a first threshold voltage and the second transistor has a second threshold voltage that is less than the first threshold voltage.

9. The method of claim 6,
wherein the method further comprises, before the forming of the sacrificial layer, recessing a first portion of the semiconductor substrate such that the semiconductor substrate comprises a recessed first portion and an unrecessed second portion, and
wherein the forming of the sacrificial layer comprises conformally depositing the sacrificial layer onto the semiconductor substrate such that the sacrificial layer has an essentially uniform thickness and such that the first portion of the sacrificial layer is on the recessed first portion of the semiconductor substrate and the second portion of the sacrificial layer is on the unrecessed second portion of the semiconductor substrate.

10. The method of claim 6,
wherein the semiconductor substrate has a planar top surface, and
wherein the forming of the sacrificial layer comprises:
depositing the sacrificial layer onto the planar top surface of the semiconductor substrate such that the sacrificial layer has a planar bottom surface and an essentially uniform thickness; and
after the depositing of the sacrificial layer, recessing the first portion of the sacrificial layer such that the sacrificial layer has a recessed first portion with a first thickness and an unrecessed second portion with a second thickness that is greater than the first thickness.

11. The method of claim 6, the first lower source/drain region and the second lower source/drain region being formed using a self-limiting epitaxial deposition process.

12. The method of claim 6, further comprising:
forming anchor regions attached to the first semiconductor fin and the second semiconductor fin and extending vertically through the sacrificial layer and into the semiconductor substrate,
wherein the etching of the sacrificial layer to expose the semiconductor substrate comprises performing a selective isotropic etch process to completely remove the sacrificial layer from below the first semiconductor fin and the second semiconductor fin, and
wherein the anchor regions provide support for the first semiconductor fin and the second semiconductor fin until the first lower source/drain region and the second lower source/drain region are formed.

13. The method of claim 6, wherein the etching of the sacrificial layer to expose the semiconductor substrate comprises performing a selective anisotropic etch process so that fin-shaped sections of the sacrificial layer remain aligned below the first semiconductor fin and the second semiconductor fin, respectively.

14. The method of claim 6, further comprising forming a trench isolation region between the first lower source/drain region and the second lower source/drain region.

15. A structure comprising:
a semiconductor substrate;
a first transistor comprising a first lower source/drain region on the semiconductor substrate and a first semiconductor fin extending vertically upward from a top surface of the first lower source/drain region; and
a second transistor comprising a second lower source/drain region on the semiconductor substrate and a second semiconductor fin extending upward from a top surface of the second lower source/drain region,
wherein a height of the top surface of the first lower source/drain region as measured from a planar bottom surface of the semiconductor substrate is less than a height of the top surface of the second lower source/drain region as measured from the planar bottom surface of the semiconductor substrate such that the top surface of the first lower source/drain region is below a level of the top surface of the second lower source/drain region, and
wherein the first semiconductor fin and the second semiconductor fin comprise monocrystalline epitaxial semiconductor material and are physically separated from the semiconductor substrate by the first lower source/drain region and the second lower source/drain region, respectively.

16. The structure of claim 15,
wherein the first transistor further comprises:
a first upper source/drain region, wherein the first semiconductor fin extends vertically between the first lower source/drain region and the first upper source/drain region;
a first lower spacer above the first lower source/drain region and positioned laterally adjacent to the first semiconductor fin;
a first gate above the first lower spacer and positioned laterally adjacent to the first semiconductor fin; and
a first upper spacer between the first gate and the first upper source/drain region and positioned laterally adjacent to the first semiconductor fin,
wherein the second transistor comprises:
a second upper source/drain region, wherein the second semiconductor fin extends vertically between the second lower source/drain region and the second upper source/drain region, the second semiconductor fin being shorter than the first semiconductor fin;
a second lower spacer above the second lower source/drain region and positioned laterally adjacent to the second semiconductor fin, wherein a top surface of the first lower spacer is below a level of a top surface of the second lower spacer;
a second gate above the second lower spacer and positioned laterally adjacent to the second semiconductor fin, the first gate and the second gate having co-planar top surfaces such that the first gate has a first gate length and the second gate has a second gate length that is less than the first gate length; and
a second upper spacer between the second gate and the second upper source/drain region and positioned laterally adjacent to the second semiconductor fin, and
wherein the structure further comprises a trench isolation region between the first lower source/drain region and the second lower source/drain region.

17. The structure of claim 15, wherein the first transistor has a higher threshold voltage than the second transistor.

18. The structure of claim 15,
wherein the semiconductor substrate has a recessed first portion and an unrecessed second portion,
wherein the first lower source/drain region is above the recessed first portion,
wherein the second lower source/drain region is above the unrecessed second portion, and
wherein the first lower source/drain region and the second lower source/drain region have approximately equal thicknesses.

19. The structure of claim 15,
wherein the semiconductor substrate has a planar top surface,
wherein the first lower source/drain region has a first thickness, and wherein the second lower source/drain region has a second thickness that is greater than the first thickness.

* * * * *